(12) United States Patent
Arai

(10) Patent No.: US 7,928,511 B2
(45) Date of Patent: Apr. 19, 2011

(54) SEMICONDUCTOR DEVICE AND METHOD FOR MANUFACTURING SEMICONDUCTOR DEVICE

(75) Inventor: Chihiro Arai, Kanagawa (JP)

(73) Assignee: Sony Corporation, Tokyo (JP)

( * ) Notice: Subject to any disclaimer, the term of this patent is extended or adjusted under 35 U.S.C. 154(b) by 544 days.

(21) Appl. No.: 12/066,629

(22) PCT Filed: Aug. 10, 2006

(86) PCT No.: PCT/JP2006/315837
§ 371 (c)(1),
(2), (4) Date: Mar. 12, 2008

(87) PCT Pub. No.: WO2007/032165
PCT Pub. Date: Mar. 22, 2007

(65) Prior Publication Data
US 2010/0155867 A1    Jun. 24, 2010

(30) Foreign Application Priority Data
Sep. 12, 2005 (JP) ................ P2005-263366

(51) Int. Cl.
*H01L 29/78* (2006.01)
(52) U.S. Cl. ................ 257/362; 257/E27.112
(58) Field of Classification Search .......... 257/347–350, 257/362, E27.112
See application file for complete search history.

(56) References Cited

U.S. PATENT DOCUMENTS

| | | | |
|---|---|---|---|
| 5,610,790 A * | 3/1997 | Staab et al. ............... | 361/56 |
| 5,898,209 A | 4/1999 | Takakura | |
| 6,252,286 B1 | 6/2001 | Arai | |
| 6,376,871 B1 | 4/2002 | Arai | |
| 6,649,944 B2 * | 11/2003 | Ker et al. ............... | 257/199 |
| 6,787,693 B2 | 9/2004 | Lizotte | |
| 6,963,173 B2 * | 11/2005 | Kawachi et al. ........... | 315/169.2 |
| 2003/0080350 A1 * | 5/2003 | Ker et al. ............... | 257/199 |
| 2003/0106580 A1 | 6/2003 | Lizotte | |
| 2004/0021178 A1 * | 2/2004 | Larson ................... | 257/355 |
| 2008/0212361 A1 * | 9/2008 | Bertin et al. ............ | 365/151 |

(Continued)

FOREIGN PATENT DOCUMENTS

JP     8-18093     1/1996

(Continued)

OTHER PUBLICATIONS

Japanese Office Action (JP2005-263366) issued on Dec. 15, 2009.

(Continued)

*Primary Examiner* — Nathan W Ha
(74) *Attorney, Agent, or Firm* — K&L Gates LLP

(57) ABSTRACT

A semiconductor device (1) includes a plurality of photodiodes (20) on a semiconductor substrate (11). Cathodes (22) and a common anode (21) of the plurality of photodiodes (20 (20a, 20b)) are formed so as to be electrically independent from the semiconductor substrate (11), the plurality of photodiodes (20) have the common anode (21) and the plurality of separate cathodes (22), and an output of the common anode (21) is considered to be equivalent to a sum of outputs of the plurality of separate photodiodes (20). Alternatively, the plurality of photodiodes have a common cathode and a plurality of separate anodes, and an output of the common cathode is considered to be equivalent to a sum of outputs of a plurality of separate photodiodes. By completely electrically isolating the anode and the cathode of the photodiodes from the substrate, the noise characteristic can be reduced, and crosstalk can be reduced.

15 Claims, 25 Drawing Sheets

U.S. PATENT DOCUMENTS

| | | | |
|---|---|---|---|
| 2010/0156511 A1* | 6/2010 | Botula et al. | 327/535 |
| 2010/0190312 A1* | 7/2010 | Kusumoto et al. | 438/381 |
| 2010/0279483 A1* | 11/2010 | Collins et al. | 438/379 |

FOREIGN PATENT DOCUMENTS

| | | |
|---|---|---|
| JP | 09-331080 | 12/1997 |
| JP | 10-242312 | 9/1998 |
| JP | 11-266033 | 9/1999 |
| JP | 2000-150842 | 5/2000 |
| JP | 2000-277792 | 10/2000 |
| JP | 2001-60713 | 3/2001 |
| JP | 2001-345436 | 12/2001 |
| JP | 2003-204070 | 7/2003 |
| JP | 2004-71058 | 3/2004 |
| JP | 09-237912 | 9/2007 |

OTHER PUBLICATIONS

Japanese Office Action issued on Mar. 17, 2009, for corresponding Japanese Patent Application JP 2005-263366.

* cited by examiner

SEMICONDUCTOR DEVICE AND METHOD FOR MANUFACTURING SEMICONDUCTOR DEVICE

CROSS REFERENCE TO RELATED APPLICATIONS

The present application claims priority to Japanese Patent Document No. 2005-263366 filed on Sep. 12, 2005, the disclosure of which is herein incorporated by reference.

BACKGROUND

The present invention relates to a semiconductor device and a method for manufacturing the semiconductor device and, in particular, to a semiconductor device and a method for manufacturing a semiconductor device including a so-called photodetector integrated circuit in which a photodiode serving as a photodetector device and a semiconductor integrated circuit, such as a bipolar integrated circuit or a MOS integrated circuit, are formed on the same semiconductor substrate.

A semiconductor device including a photodetector integrated circuit (a photodetector IC) is a semiconductor device in which a photodiode serving as a photodetector device converts light into an electrical current and performs signal processing, such as IV (electrical current to voltage) conversion and a matrix circuit.

An existing photodetector IC semiconductor device is described below with reference to FIG. 24.

As shown in FIG. 24, an anode of photodiodes 201 to 204 is formed by a P-type silicon substrate 210, a P-type buried layer 211, and a low-density P-type epitaxial layer 212 formed on the P-type silicon substrate 210 and the P-type buried layer 211. A plurality of cathodes (two in FIG. 24) are formed by an N-type cathode region 214 (refer to, for example, Japanese Unexamined Patent Application Publication No. 11-266033 or Japanese Unexamined Patent Application Publication No. 2001-60713). In addition, the anode is led out using a P-type anode leading-out region 213. Furthermore, an element (not shown) of a semiconductor integrated circuit that performs signal processing is provided outside the P-type anode leading-out region 213.

In addition, as shown in FIG. 25, in a circuit function of an existing photodiode integrated circuit, the output of each of the photodiodes 201 to 204 is current/voltage (IV)-converted and is computed so that a focus tracking signal of an optical disk is led out. Thereafter, a summing amplifier Aadd sums the outputs to generate an RF (WRF, RRF) signal serving as a data signal of the optical disk.

A problem to be solved is that, since the circuit function of an existing photodiode integrated circuit leads out a focus tracking signal of an optical disk by current/voltage (IV)-converting the outputs of photodiodes and computing the outputs, and retrieves the sum of the outputs as an RF signal serving as a data signal of the optical disk, the noise of the RF signal is increased, and therefore, the S/N ratio is increased. This is because the outputs of the photodiodes are current/voltage-converted and, subsequently, are summed, or the outputs of the photodiodes are summed and, subsequently, are current/voltage-converted. In addition, the P-type substrate serves as an anode that is common to all the photodiodes. However, when an RF signal is led out from the P-type substrate, it is difficult to lead out only the common anode output of the photodiodes. This is because the P-type substrate functions as the GND of a circuit of a bipolar device or a CMOS device that performs signal processing. Furthermore, in the photodiode having an existing structure illustrated in FIG. 24, the photodiodes 201 and 202 have a common anode, and the photodiodes 203 and 204 have a common anode. Thus, crosstalk occurs between the photodiodes 201 and 202 and between the photodiodes 203 and 204. In the case of a photodiode pattern to which three light spots are emitted, as shown in FIG. 26, crosstalk disadvantageously occurs among the photodiodes 301, 302, and 303, each including four segments.

SUMMARY

An object of the present invention is to provides a technology in which cathodes and anodes of a plurality of photodiodes are formed so as to be electrically independent from a semiconductor substrate, the plurality of photodiodes have a common anode (cathode) and a plurality of separate cathodes (anodes), and an RF signal can be retrieved without summing the outputs of the photodiodes by considering the output of the common anode (cathode) to be equivalent to a sum of the outputs of the plurality of separate photodiodes. Another object of the present invention is to provide a technology in which crosstalk is decreased.

According to the present invention, a semiconductor device having a plurality of photodiodes on a semiconductor substrate is characterized in that cathodes and anodes of the plurality of photodiodes are formed so as to be electrically independent from the semiconductor substrate, the plurality of photodiodes have a common anode and a plurality of separate cathodes, and an output from the common anode is considered to be equivalent to a sum of outputs of the plurality of separate photodiodes, or in that the plurality of photodiodes have a common cathode and a plurality of separate anodes, and an output from the common cathode is considered to be equivalent to a sum of outputs of the plurality of separate photodiodes.

In each of the semiconductor devices, since the cathodes and anodes of the plurality of photodiodes are formed so as to be electrically independent from the semiconductor substrate, an RF signal can be obtained from the common anode (or the cathode). In addition, by considering the output of the common anode (cathode) to be equivalent to a sum of outputs of the plurality of separate photodiodes, the RF signal can be obtained without summing the outputs of the individual photodiodes.

According to the present invention, a first method for manufacturing a semiconductor device is characterized in that the method comprises the steps of forming a P-type buried layer on an insulating layer formed on a semiconductor substrate, forming, on the buried layer, a P-type low-density layer having a density lower than that of the buried layer, forming an isolation region that reaches the insulating layer so as to segment and isolate the low-density layer and the buried layer into an independent common anode region, and forming, in the low-density layer, an N-type region serving as a cathode of a photodiode.

According to the present invention, a second method for manufacturing a semiconductor device is characterized in that the method comprises the steps of forming an N-type buried layer on an insulating layer formed on a semiconductor substrate, forming, on the buried layer, an N-type low-density layer having a density lower than that of the buried layer, forming an isolation region that reaches the insulating layer so as to segment and isolate the low-density layer and the buried layer into an independent common cathode region, and forming, in the low-density layer, a P-type region serving as an anode of a photodiode.

In the first and second methods for manufacturing a semiconductor device, the buried layer and the low-density layer serving as a common anode or a common cathode are formed on the insulating layer formed on the semiconductor substrate. In addition, the isolation region is formed so as to reach the insulating layer. Accordingly, the buried layer and the low-density layer are formed so as to be electrically independent from the semiconductor substrate by the insulating layer and the isolation region. The common anode or the common cathode is formed by the buried layer and the low-density layer.

According to the present invention, a third method for manufacturing a semiconductor device is characterized in that the method comprises the steps of forming a P-type buried layer in an N-type semiconductor substrate, forming a lower layer of an N-type isolation layer serving as a PN-junction type isolation region in the semiconductor substrate, forming, on the buried layer and the semiconductor substrate including the lower layer of the isolation region, a P-type low-density layer having a density lower than that of the buried layer, forming, in the low-density layer, an upper layer of the N-type isolation layer that reaches the lower layer of the isolation layer so as to segment an independent common anode region using the lower layer and the upper layer of the isolation layer and the semiconductor substrate, and forming, in the low-density layer, an N-type region serving as a cathode of a photodiode.

According to the present invention, a fourth method for manufacturing a semiconductor device is characterized in that the method comprises the steps of forming an N-type buried layer in a P-type semiconductor substrate, forming a lower layer of a P-type isolation layer serving as a PN-junction type isolation region in the semiconductor substrate, forming, on the buried layer and the semiconductor substrate including the lower layer of the isolation region, an N-type low-density layer having a density lower than that of the buried layer, forming, in the low-density layer, an upper layer of the P-type isolation layer that reaches the lower layer of the isolation layer so as to segment an independent common cathode using the lower layer and the upper layer of the isolation layer and the semiconductor substrate, and forming, in the low-density layer, a P-type region serving as an anode of a photodiode.

In the third and fourth methods for manufacturing a semiconductor device, a buried layer having a conductivity type that is opposite to that of the semiconductor substrate is formed in the semiconductor substrate. In addition, a lower layer of an isolation region having a conductivity type that is the same as that of the semiconductor substrate is formed in the semiconductor substrate. Furthermore, a low-density layer having a conductivity type that is opposite to that of the semiconductor substrate is formed on the semiconductor substrate. An upper layer of the isolation region having a conductivity type that is the same as that of the semiconductor substrate is formed in the low-density layer so as to reach the lower layer of the isolation region. Accordingly, the buried layer and the low-density layer that are electrically independent from the semiconductor substrate are formed by isolation using a PN junction. The buried layer and the low-density layer form a common anode or a common cathode.

Additional features and advantages of the present invention are described in, and will be apparent from, the following Detailed Description and the Figures.

DETAILED DESCRIPTION

Figure 1:
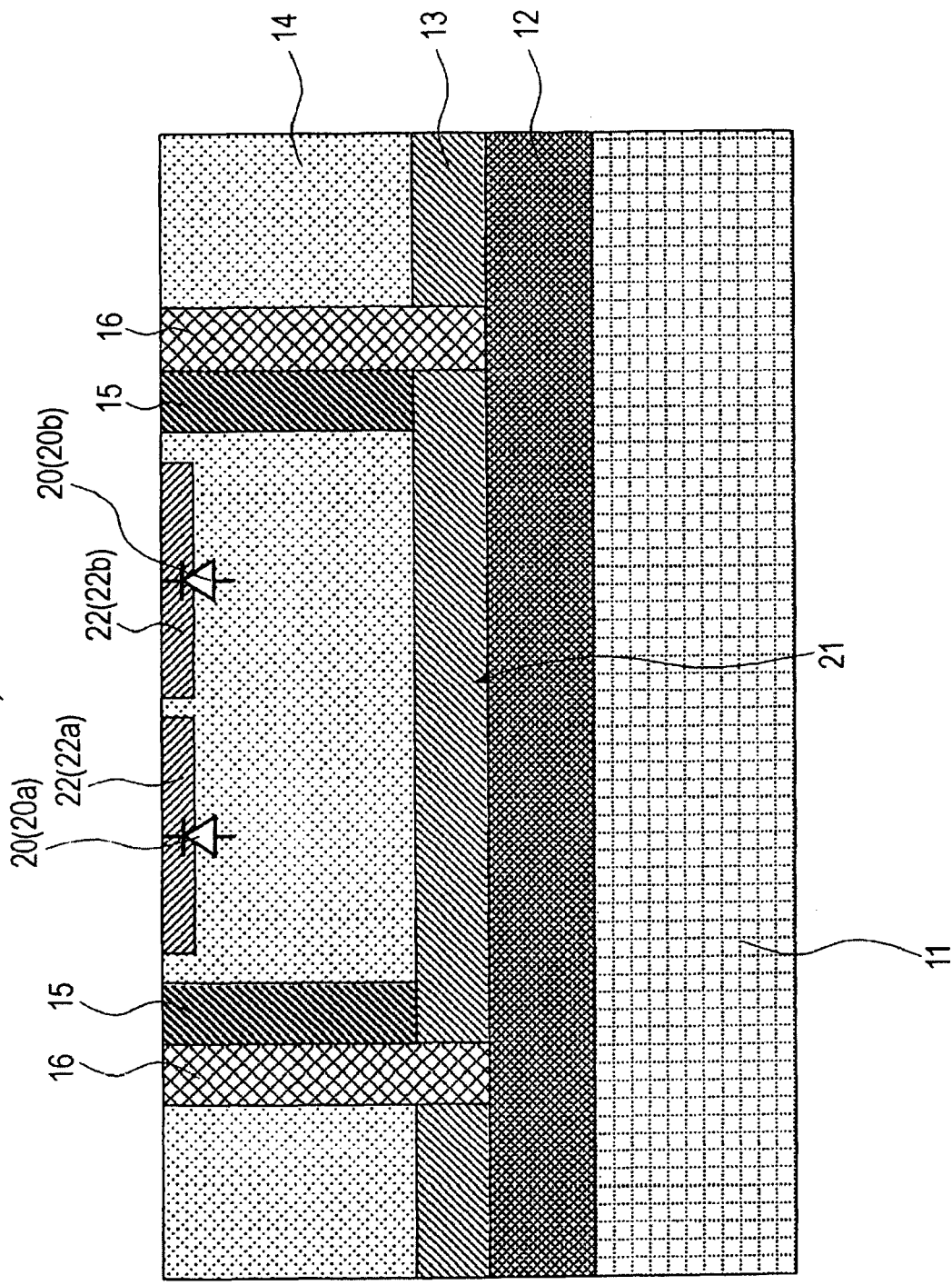
FIG. 1 is a cross-sectional view of a schematic configuration illustrating a first example of an embodiment of a semiconductor device according to the present invention.

A first example of an embodiment of a semiconductor device according to the present invention is described with reference to a cross-sectional view of the schematic structure shown in FIG. 1. FIG. 1 illustrates an example of a semiconductor device including a plurality of photodiodes electrically isolated from a semiconductor substrate using an SOI (Silicon on insulator) substrate.

As illustrated in FIG. 1, an SOI (Silicon on insulator) substrate is employed in which an insulating layer 12 is formed on a semiconductor substrate 11, and a silicon layer is formed on the insulating layer 12. The insulating layer 12 is formed from a silicon oxide film. A $P^+$ type impurity is introduced into the silicon layer. This silicon layer serves as a $P^+$ type buried layer 13. For example, the impurity density of the buried layer 13 is set to a value higher than or equal to $1\times10^{16}/cm^3$ and lower than or equal to $1\times10^{22}/cm^3$. A $P^-$ type low-density layer 14 is formed on the buried layer 13. The low-density layer 14 has a density lower than that of the buried layer 13. The low-density layer 14 is formed from a $P^-$ silicon layer formed by using, for example, epitaxial growth. The impurity density of the low-density layer 14 is set to a value higher than or equal to $1\times10^{11}/cm^3$ and lower than or equal to $1\times10^{16}/cm^3$. It is desirable that the thickness of a semiconductor region formed from the buried layer 13 and the low-density layer 14 is greater than the optical-absorption length. Thus, a structure having a high light receiving sensitivity of a photodiode can be achieved. This structure is described below.

By setting the impurity density of the buried layer 13 serving as a high density region in such a manner, the electrical resistance of the buried layer 13 can be decreased and the frequency characteristics can be extended. In addition, by setting the impurity density of the low-density layer 14, the impurity density can be decreased and a depletion layer can be easily expanded. Thus, the frequency characteristics can be improved and the light receiving sensitivity can be improved due to a decrease in capacitance.

In the low-density layer 14, an anode leading-out region 15 is formed so as to reach the buried layer 13. The anode leading-out region 15 is formed from, for example, a $P^+$ impurity layer having a density higher than that of the low-density layer 13. For example, the density of the $P^+$ impurity layer can be set to a density that is the same as that of the buried layer 13. A common anode 21 is formed from the buried layer 13, the low-density layer 14, and the anode leading-out region 15. The common anode 21 is isolated by an isolation region 16 that is formed in the low-density layer 14 and the buried layer 13 so as to reach the insulating layer 12. For example, the isolation layer 16 is formed from deep trench isolation. Accordingly, one common anode 21 is electrically isolated from the neighboring common anode 21 and the semiconductor substrate 11 by the isolation region 16 and the insulating layer 12.

A plurality of cathodes 22 are formed in an upper portion of the low-density layer 14 of the common anode 21. The cathodes 22 are formed from, for example, an N-type layer. Accordingly, two photodiodes 20 (20a) and 20 (20b) are formed. Note that, in the drawing, two cathodes 22a and 22b are formed for one common anode 21. However, three, four or more cathodes 22 (not shown) may be formed.

As described above, by employing the isolation technique using an SOI substrate and the isolation region 16 with the deep trench isolation structure that reaches the insulating layer 12 formed from a silicon oxide film, the photodiodes 20 can be completely insulated and isolated from the semiconductor substrate 11. Thus, the output of the common anode 21 of the photodiodes 20 can be obtained as a sum signal of the photodiodes having the separated cathodes 22.

For example, the photodiodes 20 receive a reflected light ray (not shown) from an optical disk (not shown) and can directly use the output of the common anode 21 as an RF signal without using a summing amplifier. In addition, signals from a plurality of the separate cathodes 22 can be used for signal processing for, for example, focus tracking.

Figure 2:
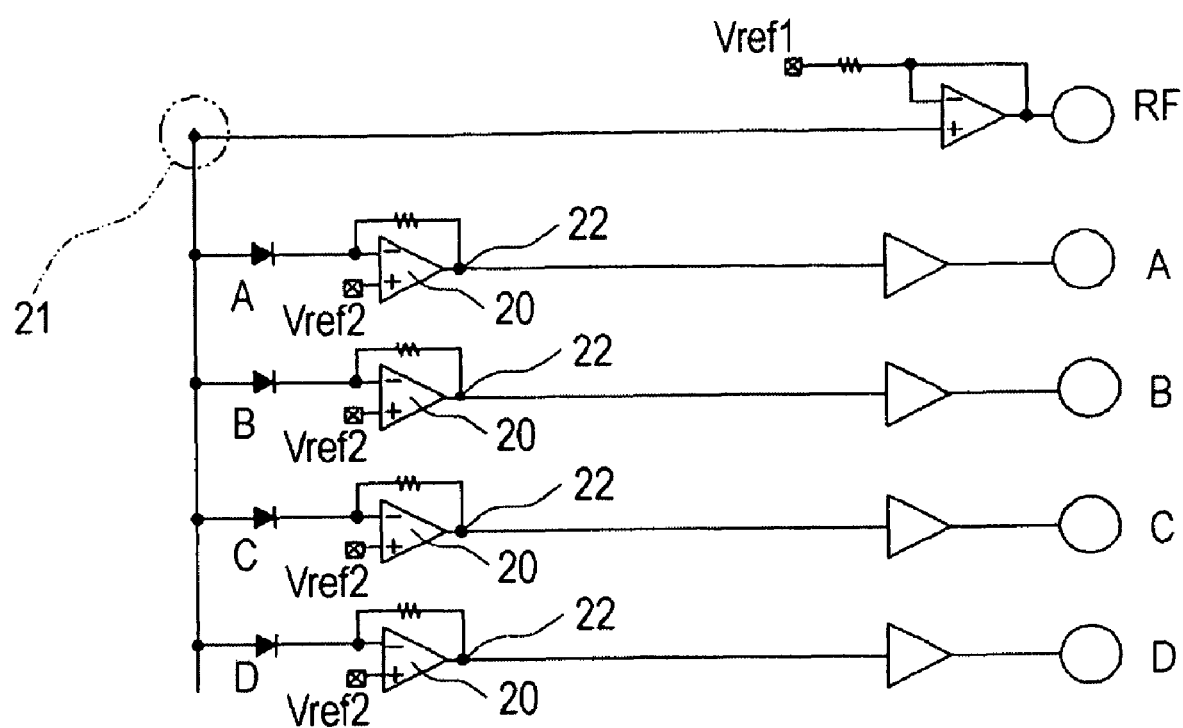
FIG. 2 is an equivalent circuit diagram illustrating the first example of an embodiment of a semiconductor device according to the present invention.

According to the present invention, a semiconductor device 1 includes the cathodes 22 and the common anode 21 of a plurality of the photodiodes 20 that are formed so as to be electrically independent from the semiconductor substrate. Accordingly, for example, as illustrated by an equivalent circuit in FIG. 2, the output of the common anode 21 can be directly used as an RF signal without using a summing amplifier. That is, by using the output of the common anode 21 as equivalence of a sum signal of a plurality of the separate photodiodes 20, the RF signal can be obtained without summing the outputs of the photodiodes 20. In addition, the outputs of a plurality of the separate cathodes 22 can be used as signals subjected to computation for, for example, focus tracking. In this way, noise can be advantageously reduced, and the S/N ratio and the frequency range can be improved. Furthermore, the need for forming an existing summing amplifier is eliminated. Accordingly, the configuration of the device can be simplified. Still furthermore, since the photodiodes 20 and the semiconductor substrate 11 are configured so as to be independent from each other, a configuration that prevents crosstalk between the photodiodes 20 can be provided.

Figure 3:
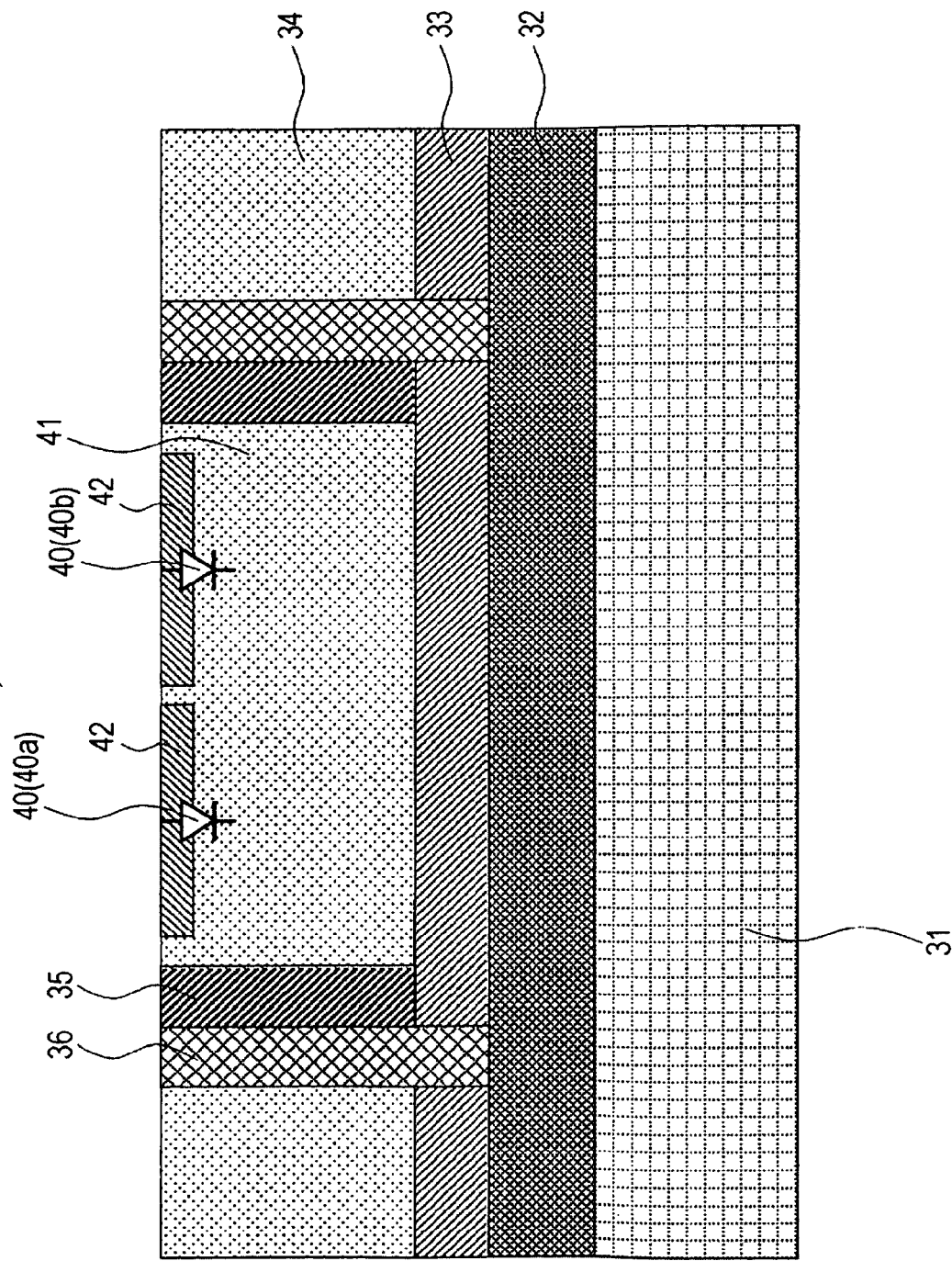
FIG. 3 is a cross-sectional view of a schematic configuration illustrating the first example of an embodiment of a semiconductor device according to the present invention.

A second example of an embodiment of a semiconductor device according to the present invention is described with reference to a cross-sectional view of the schematic structure shown in FIG. 3. FIG. 3 illustrates an example of modification of the semiconductor device illustrated in FIG. 1.

As illustrated in FIG. 3, an SOI (Silicon on insulator) substrate is employed in which an insulating layer 32 is formed on a semiconductor substrate 31, and a silicon layer is formed on the insulating layer 32. The insulating layer 32 is formed from a silicon oxide film. An N+ type impurity is introduced into the silicon layer. This silicon layer is used as an N+ type buried layer 33. For example, the impurity density of the buried layer 33 is set to a value higher than or equal to $1\times10^{16}/cm^3$ and lower than or equal to $1\times10^{22}/cm^3$. An N− type low-density layer 34 is formed on the buried layer 33. The low-density layer 34 has a density lower than that of the buried layer 33. The low-density layer 34 is formed from an N− silicon layer formed by using, for example, epitaxial growth. The impurity density of the low-density layer 34 is set to a value higher than or equal to $1\times10^{11}/cm^3$ and lower than or equal to $1\times10^{16}/cm^3$. It is desirable that the thickness of a semiconductor region formed from the buried layer 33 and the low-density layer 34 is greater than the optical-absorption length. Thus, a structure having a high light receiving sensitivity of a photodiode can be achieved. This structure is described below.

By setting the impurity density of the buried layer 33 serving as a high density region in such a manner, the electrical resistance of the buried layer 33 can be decreased and the frequency characteristics can be extended. In addition, by setting the impurity density of the low-density layer 34, the impurity density can be decreased and a depletion layer can be easily expanded. Thus, the frequency characteristics can be improved and the light receiving sensitivity can be improved due to a decrease in capacitance.

In the low-density layer 34, an anode leading-out region 35 is formed so as to reach the buried layer 33. The anode leading-out region 35 is formed from, for example, an N+ impurity layer having a density higher than that of the low-density layer 33. For example, the density of the N+ impurity layer can be set to a density that is the same as that of the buried layer 33. A common cathode 41 is formed from the buried layer 33, the low-density layer 34, and the cathode leading-out region 35. The common cathode 41 is isolated by an isolation region 36 that is formed in the low-density layer 34 and the buried layer 33 so as to reach the insulating layer 32. For example, the isolation layer 36 is formed from deep trench isolation. Accordingly, one common cathode 41 is electrically isolated from the neighboring common cathode 41 and the semiconductor substrate 31 by the isolation region 36 and the insulating layer 32.

A plurality of anodes 42 are formed in an upper portion of the low-density layer 34 of the common cathode 41. The anodes 42 are formed from, for example, P-type layers. Accordingly, two photodiodes 40 (40a) and 40 (40b) are formed. Note that, in the drawing, two anodes 42a and 42b are formed for one common cathode 41. However, three, four or more anodes 42 (not shown) may be formed.

As described above, by employing the isolation technique using an SOI substrate and the isolation region 36 with the deep trench isolation structure that reaches the insulating layer 32 formed from a silicon oxide film, the photodiodes 40 can be completely insulated and isolated from the semiconductor substrate 31. Thus, the output of the common cathode 41 of the photodiodes 40 can be obtained as a sum signal of the photodiodes 40 having the separated anodes 42.

For example, the photodiodes 40 receive a reflected light ray (not shown) from an optical disk (not shown) and can directly use the output of the common cathode 41 as an RF signal without using a summing amplifier. In addition, signals from a plurality of the separate anodes 42 can be used for signal processing for, for example, focus tracking.

According to the present invention, a semiconductor device 2 includes the anodes 42 and the common cathode 41 of a plurality of the photodiodes 40 that are formed so as to be electrically independent from the semiconductor substrate. Accordingly, the output of the common cathode 41 can be directly used as an RF signal without using a summing amplifier. That is, by using the output of the common cathode 41 as equivalence of a sum signal of a plurality of the separate photodiodes 40, the RF signal can be obtained without summing the outputs of the photodiodes 40. In addition, the outputs of a plurality of the separate anodes 42 can be used as signals subjected to computation for, for example, focus tracking. In this way, noise can be advantageously reduced, and the S/N ratio and the frequency range can be improved. Furthermore, the need for forming an existing summing amplifier is eliminated. Accordingly, the configuration of the device can be simplified. Still furthermore, since the photodiodes 40 and the semiconductor substrate 31 are configured so as to be independent from each other, a configuration that prevents crosstalk between the photodiodes 40 can be provided.

Figure 4:
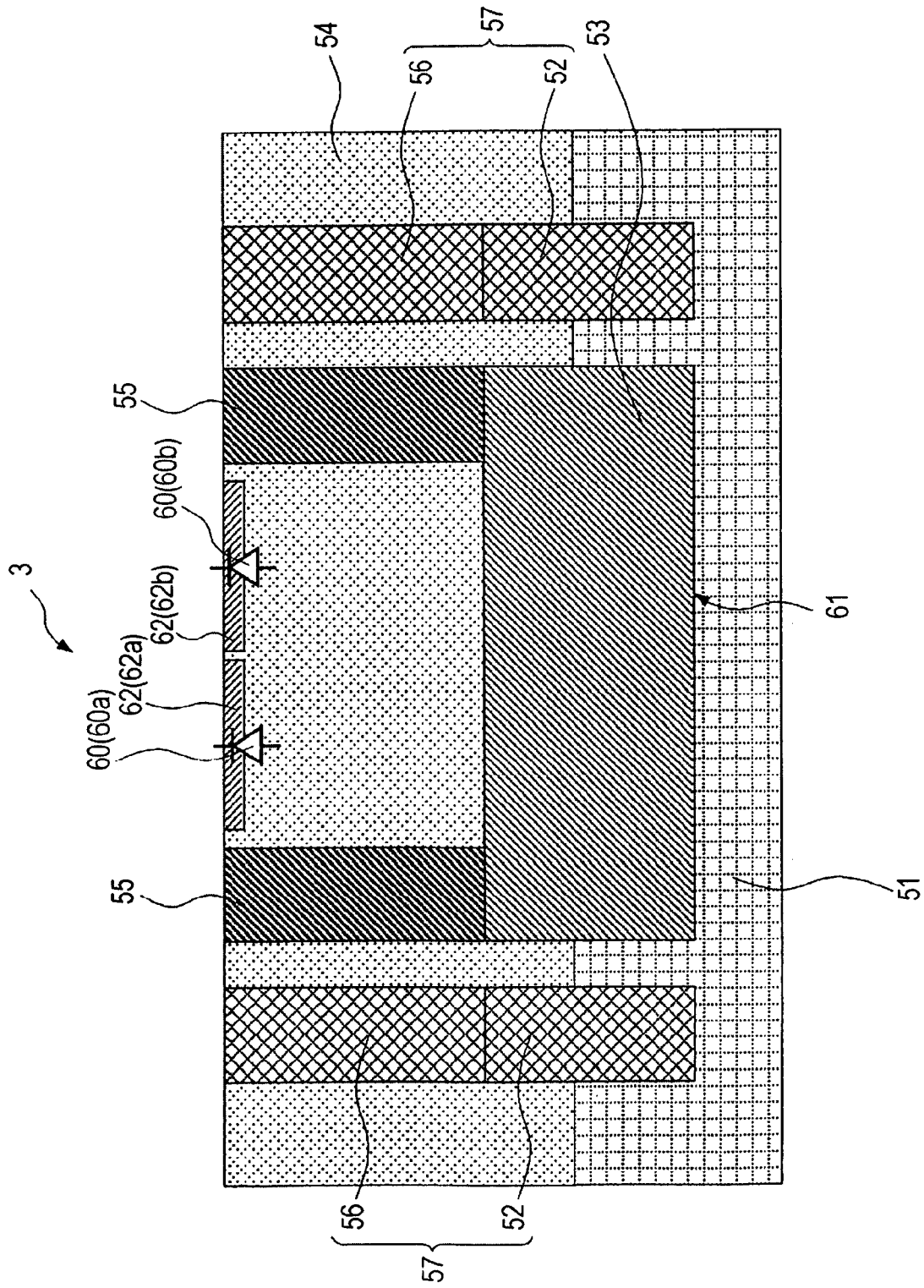
FIG. 4 is a cross-sectional view of a schematic configuration illustrating the first example of an embodiment of a semiconductor device according to the present invention.

A second example of an embodiment of a semiconductor device according to the present invention is described with reference to a cross-sectional view of the schematic structure shown in FIG. 4. FIG. 4 illustrates an example of a semiconductor device including a plurality of photodiodes in which an anode (cathode) region including a buried layer and a low-density layer is separated by a semiconductor substrate and an isolation region that employs a PN junction.

As illustrated in FIG. 4, a lower layer 52 of an N+ type isolation region and a P+ type buried layer 53 are formed in an upper portion of an N− type semiconductor substrate 51. For example, the semiconductor substrate 51 is formed from an N− type silicon substrate. In addition, the lower layer 52 of the isolation region is formed from an N+ type impurity layer. The buried layer 53 is formed from an N+ type impurity layer. The impurity density of the buried layer 53 is set to a value higher than or equal to $1\times10^{16}/cm^3$ and lower than or equal to $1\times10^{22}/cm^3$. Furthermore, a P− type low-density layer 54 is formed on the semiconductor substrate 51. The impurity density of the low-density layer 54 is set to a value higher than or equal to $1\times10^{11}/cm^3$ and lower than or equal to $1\times10^{16}/cm^3$. In addition, it is desirable that the thickness of the buried layer 53 is greater than the optical-absorption length. Thus, a structure having a high light receiving sensitivity of a photodiode can be achieved. This structure is described below. If the thickness of the buried layer 53 is less than the optical-absorption length, a parasitic photodiode occurs between the buried layer 53 and the semiconductor substrate 51. Accordingly, the output of the parasitic photodiode is detected. The output of the parasitic photodiode can be actively used as needed.

By setting the impurity density of the buried layer 53 serving as a high density region in such a manner, the electrical resistance of the buried layer 53 can be decreased and the frequency characteristics can be extended. In addition, by setting the impurity density of the low-density layer 54, the impurity density can be decreased and a depletion layer can be easily expanded. Thus, the frequency characteristics can be improved and the light receiving sensitivity can be improved due to a decrease in capacitance.

In the low-density layer 54, an anode leading-out region 55 is formed so as to reach the buried layer 53. The anode leading-out region 55 is formed from, for example, a P+ impurity layer having a density higher than that of the low-density layer 54. For example, the density of the P+ impurity layer can be set to a density that is the same as that of the buried layer 53. A common anode 61 is formed from the buried layer 53, the low-density layer 54, and the anode leading-out region 55. An upper layer 56 of the isolation region that reaches the lower layer 52 of the isolation region is formed in the low-density layer 54. For example, the upper layer 56 of the isolation region is formed from an N$^+$ type impurity layer having a high density that is the same as that of the lower layer 52 of the isolation region. Hereinafter, the lower layer 52 and the upper layer 56 of the isolation region are collectively referred to as an "isolation region 57".

The common anode 61 is isolated by the semiconductor substrate 51 and the isolation region 57. That is, the isolation is achieved by using a PN junction.

A plurality of cathodes 62 are formed in an upper portion of the low-density layer 54 of the common anode 61. The cathodes 62 are formed from, for example, N-type layers. Accordingly, two photodiodes 60 (60a) and 60 (60b) are formed. Note that, in the drawing, two cathodes 62a and 62b are formed for one common anode 61. However, three, four or more cathodes 62 (not shown) may be formed.

As described above, by isolating the common anode 61 using the isolation region 57 employing a PN junction, the photodiodes 60 can be completely electrically insulated and isolated from the semiconductor substrate 51. Thus, the output of the common anode 61 of the photodiodes 60 can be obtained as a sum signal of the photodiodes having the separate cathodes 62.

For example, the photodiodes 60 receive a reflected light ray (not shown) from an optical disk (not shown) and can directly use the output of the common anode 61 as an RF signal without using a summing amplifier. In addition, signals from a plurality of the separate cathodes 62 can be used for signal processing for, for example, focus tracking.

According to the present invention, a semiconductor device 3 includes the cathodes 62 and the common anode 61 of a plurality of the photodiodes 60 that are formed so as to be electrically independent from the semiconductor substrate. Accordingly, the output of the common anode 61 can be directly used as an RF signal without using a summing amplifier. That is, by using the output of the common anode 61 as equivalence of a sum signal of a plurality of the separate photodiodes 60, the RF signal can be obtained without summing the outputs of the photodiodes 60. In addition, the outputs of a plurality of the separate cathodes 62 can be used as signals subjected to computation for, for example, focus tracking. In this way, noise can be advantageously reduced, and the S/N ratio can be improved. Furthermore, the need for forming an existing summing amplifier is eliminated. Accordingly, the configuration of the device can be simplified. Still furthermore, since the photodiodes 60 and the semiconductor substrate 51 are configured so as to be independent from each other, a configuration that prevents crosstalk between the photodiodes 60 can be provided.

Figure 5:
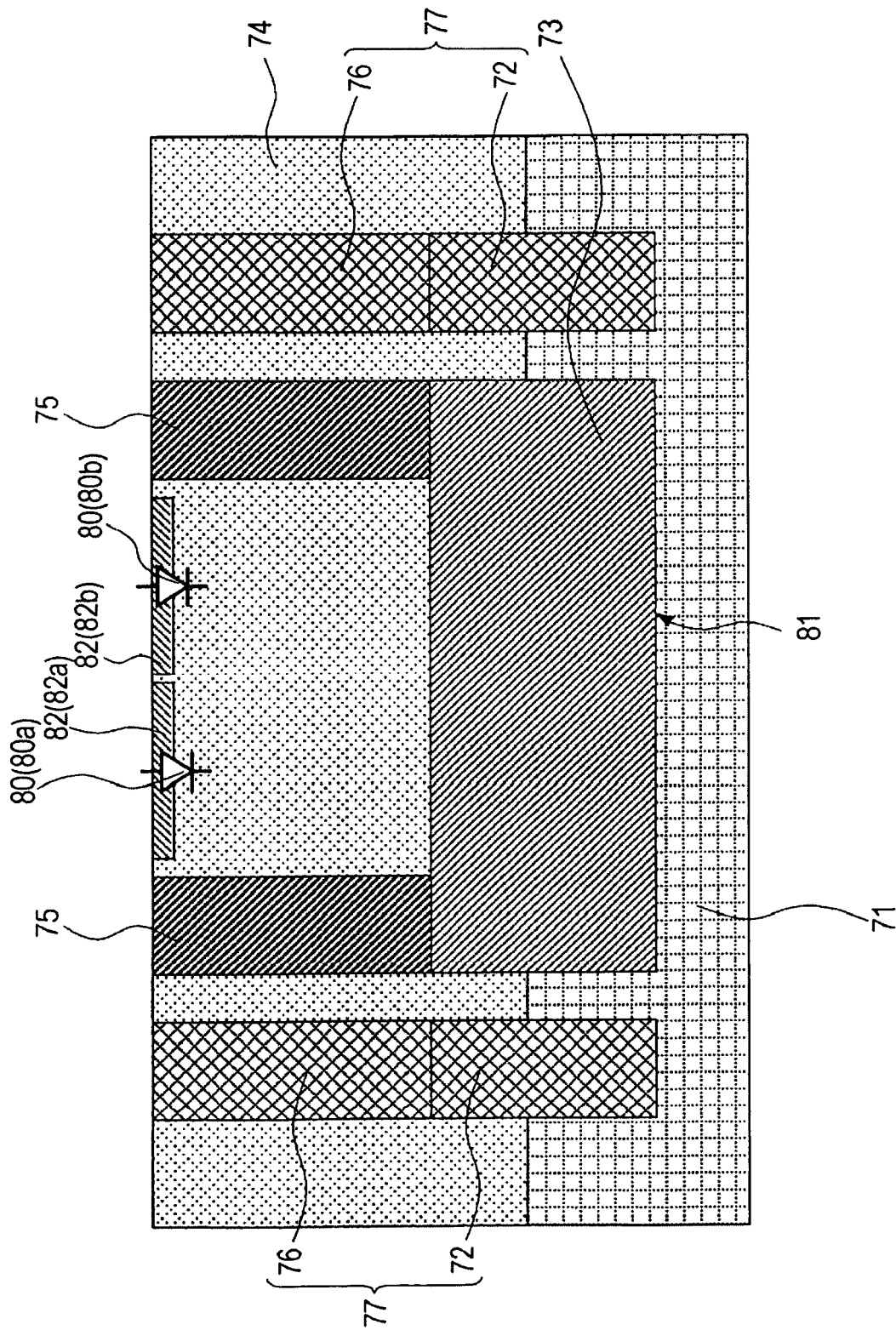
FIG. 5 is a cross-sectional view of a schematic configuration illustrating the first example of an embodiment of a semiconductor device according to the present invention.

A fourth example of an embodiment of a semiconductor device according to the present invention is described next with reference to a cross-sectional view of the schematic structure shown in FIG. 5. FIG. 5 illustrates an example of modification of the semiconductor device illustrated in FIG. 4.

As illustrated in FIG. 5, a lower layer 72 of a P$^+$ type isolation region and an N$^+$ type buried region 73 are formed in an upper portion of a P$^-$ type semiconductor substrate 71. For example, the semiconductor substrate 71 is formed from a P$^-$ type silicon substrate. In addition, the lower layer 72 of the isolation region is formed from a P$^+$ type impurity layer. The buried layer 73 is formed from a P$^+$ type impurity layer. The impurity density of the buried layer 73 is set to a value higher than or equal to $1\times10^{16}/cm^3$ and lower than or equal to $1\times10^{22}/cm^3$. Furthermore, an N$^-$ type low-density layer 74 is formed on the semiconductor substrate 71. The impurity density of the low-density layer 74 is lower than that of the buried layer 73. The impurity density of the low-density layer 74 is set to a value higher than or equal to $1\times10^{11}/cm^3$ and lower than or equal to $1\times10^{16}/cm^3$. In addition, it is desirable that the thickness of the buried region 73 is greater than the optical-absorption length. Thus, a structure having a high light receiving sensitivity of a photodiode can be achieved. This structure is described below. If the thickness of the buried region 73 is less than the optical-absorption length, a parasitic photodiode occurs between the buried region 73 and the semiconductor substrate 71. Accordingly, the output of the parasitic photodiode is detected. The output of the parasitic photodiode can be actively used as needed.

By setting the impurity density of the buried region 73 serving as a high density region in such a manner, the electrical resistance of the buried region 73 can be decreased and the frequency characteristics can be extended. In addition, by setting the impurity density of the low-density layer 74, the impurity density can be decreased and a depletion layer can be easily expanded. Thus, the frequency characteristics can be improved and the light receiving sensitivity can be improved due to a decrease in capacitance.

In the low-density layer 74, an anode leading-out region 75 is formed so as to reach the buried region 73. The anode leading-out region 75 is formed from, for example, an N$^+$ impurity layer having a density higher than that of the low-density layer 73. For example, the density of the N$^+$ impurity layer can be set to a density that is the same as that of the buried region 73. A common cathode 81 is formed from the buried region 73, the low-density layer 74, and the anode leading-out region 75. In addition, an upper layer 76 of the isolation region that reaches the lower layer 72 of the isolation region is formed in the low-density layer 74. For example, the upper layer 76 of the isolation region is formed from a P$^+$ type impurity layer having a high density that is the same as that of the lower layer 72 of the isolation region. Hereinafter, the lower layer 72 and the upper layer 76 of the isolation region are collectively referred to as an "isolation region 77".

The common cathode 81 is isolated by the semiconductor substrate 71 and the isolation region 77. That is, the isolation is achieved by using a PN junction.

A plurality of anodes 82 are formed in an upper portion of the low-density layer 74 of the common cathode 81. The anodes 82 are formed from, for example, a P-type layer. Accordingly, two photodiodes 80 (80a) and 80 (80b) are formed. Note that, in the drawing, two cathodes 82a and 82b are formed for one common cathode 81. However, three, four or more anodes 82 (not shown) may be formed.

As described above, by isolating the common cathode 81 using the isolation region 77 employing a PN junction, the photodiodes 80 can be completely electrically insulated and isolated from the semiconductor substrate 71. Thus, the output of the common cathode 81 of the photodiodes 80 can be obtained as a sum signal of the photodiodes having the separate anodes 82.

For example, the photodiodes 80 receive a reflected light ray (not shown) from an optical disk (not shown) and can directly use the output of the common cathode 81 as an RF signal without using a summing amplifier. In addition, signals from a plurality of the separate anodes 82 can be used for signal processing for, for example, focus tracking.

According to the present invention, a semiconductor device 4 includes the anodes 82 and the common cathode 81 of a plurality of the photodiodes 80 that are formed so as to be electrically independent from the semiconductor substrate. Accordingly, the output of the common cathode 81 can be directly used as an RF signal without using a summing amplifier. That is, by using the output of the common cathode 81 as equivalence of a sum signal of a plurality of the separate photodiodes 80, the RF signal can be obtained without summing the outputs of the photodiodes 80. In addition, the outputs of a plurality of the separate anodes 82 can be used as signals subjected to computation for, for example, focus tracking. In this way, noise can be advantageously reduced, and the S/N ratio and the frequency range can be improved. Furthermore, the need for forming an existing summing amplifier is eliminated. Accordingly, the configuration of the device can be simplified. Still furthermore, since the photodiodes 80 and the semiconductor substrate 71 are configured so as to be independent from each other, a configuration that prevents crosstalk between the photodiodes 80 can be provided.

An example of an embodiment of a first method for manufacturing a semiconductor device according to the present invention is described next with reference to cross-sectional views of the manufacturing processes shown in FIGS. 6 to 10. FIGS. 6 to 10 illustrate an example of a method for manufacturing a semiconductor device including a plurality of photodiodes that are electrically isolated from a semiconductor substrate by using an SOI (Silicon on insulator). That is, a method for manufacturing the semiconductor device illustrated in FIG. 1 is illustrated.

Figure 6:
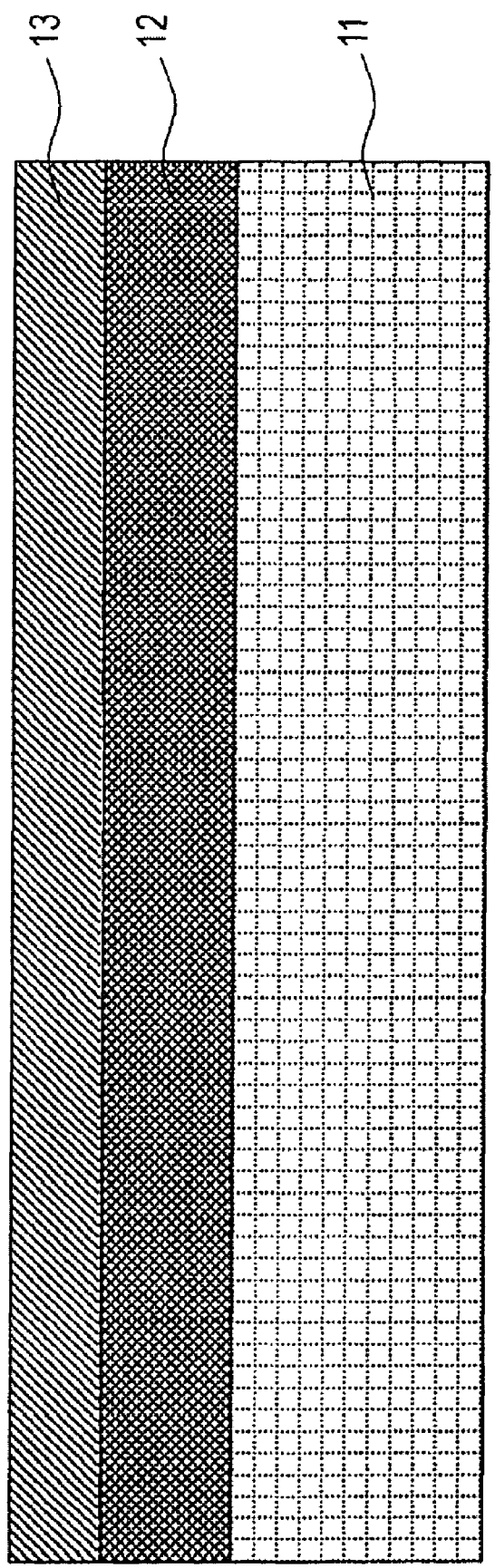
FIG. 6 is a cross-sectional view of a manufacturing process illustrating an example of an embodiment of a first method for manufacturing a semiconductor device according to the present invention.

As illustrated in FIG. 6, an SOI (Silicon on insulator) substrate is employed in which an insulating layer 12 is formed on a semiconductor substrate 11, and a silicon layer is formed on the insulating layer 12. The insulating layer 12 is formed from a silicon oxide film. A P-type impurity is introduced into the silicon layer. This silicon layer is used as a P$^+$ type buried layer 13. For example, the buried layer 13 is formed by introducing a P type impurity so that the impurity density of the buried layer 13 is higher than or equal to $1\times10^{16}$/cm$^3$ and lower than or equal to $1\times10^{22}$/cm$^3$. For example, the P-type impurity is introduced so that the density is about $1\times10^{19}$/cm$^3$. By setting the impurity density of the buried layer 13 serving as a high density region in such a manner, the electrical resistance of the buried layer 13 can be decreased and the frequency characteristics can be extended.

Figure 7:
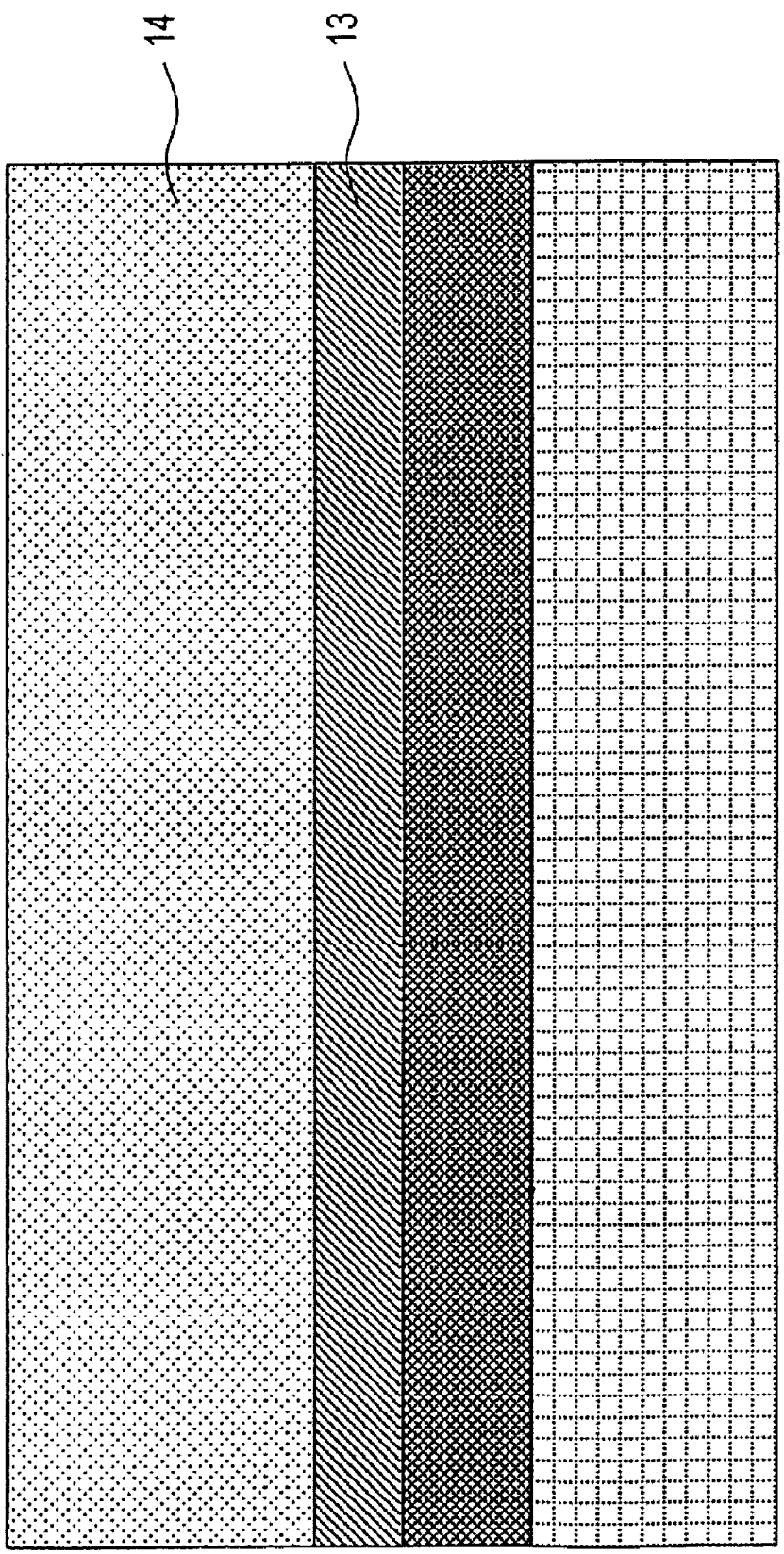
FIG. 7 is a cross-sectional view of a manufacturing process illustrating an example of an embodiment of the first method for manufacturing a semiconductor device according to the present invention.

Subsequently, as illustrated in FIG. 7, a low-density layer 14 is formed on the buried layer 13. The low-density layer 14 is a P$^-$ type silicon layer formed by using, for example, epitaxial growth. The density of the low-density layer 14 is lower than that of the buried layer 13. The impurity density of the low-density layer 14 is set to a value higher than or equal to $1\times10^{11}$/cm$^3$ and lower than or equal to $1\times10^{16}$/cm$^3$. For example, the low-density layer 14 is formed by depositing a P-type epitaxial layer having a thickness of 20 μm so as to have a value of about 700 Ω·cm. In addition, by setting the impurity density of the low-density layer 14 in such a manner, the impurity density can be decreased and a depletion layer can be easily expanded. Thus, the frequency characteristics can be improved and the light receiving sensitivity can be improved due to a decrease in capacitance. Furthermore, it is desirable that the thickness of a semiconductor region formed from the buried layer 13 and the low-density layer 14 is greater than the optical-absorption length. Thus, a structure having a high light receiving sensitivity of a photodiode can be achieved. This structure is described below.

Figure 8:
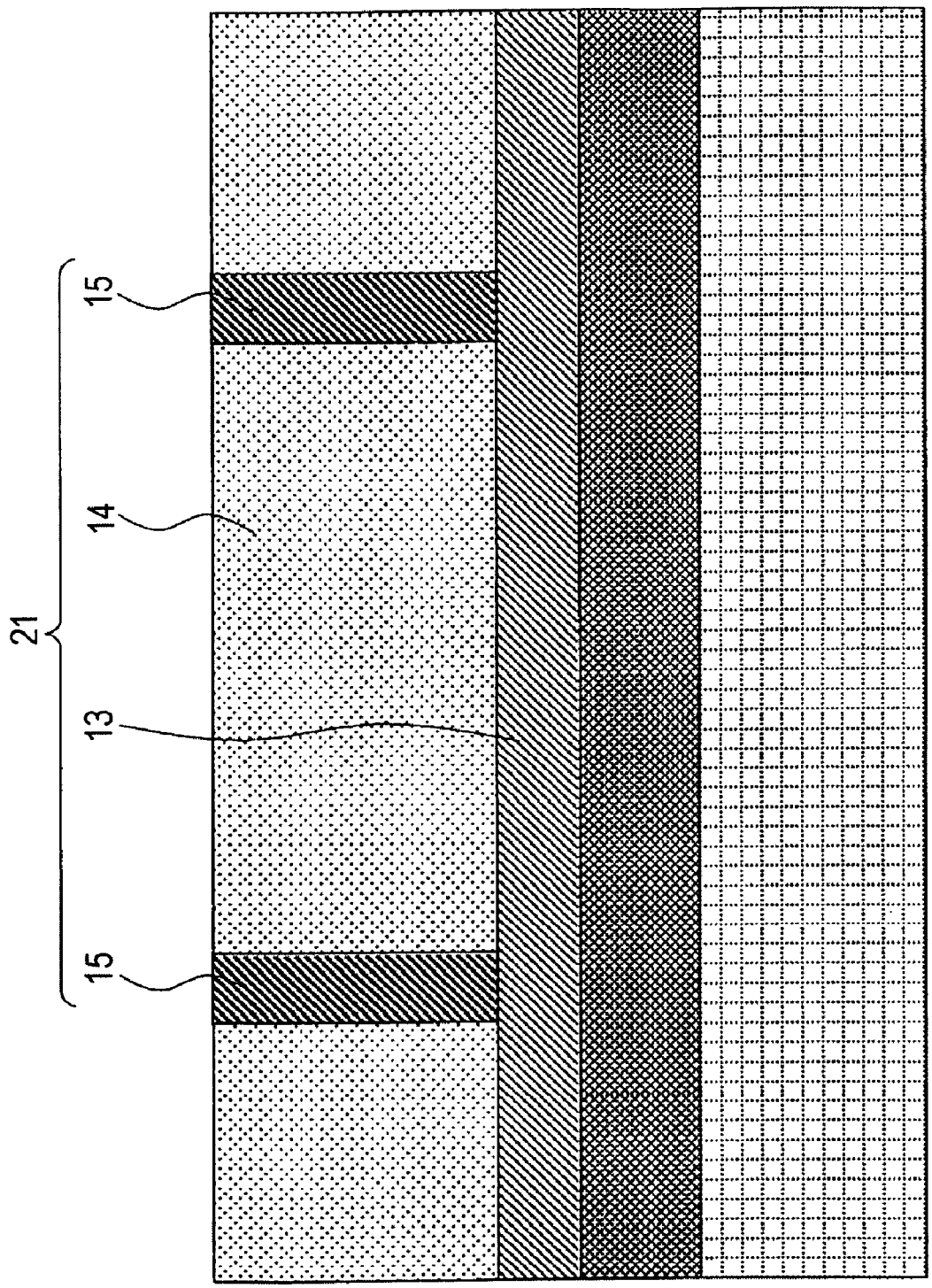
FIG. 8 is a cross-sectional view of a manufacturing process illustrating an example of an embodiment of the first method for manufacturing a semiconductor device according to the present invention.

Thereafter, as illustrated in FIG. 8, an anode leading-out region 15 is formed in the low-density layer 14 so as to reach the buried layer 13. The anode leading-out region 15 is formed from, for example, a P impurity layer having a density higher than that of the low-density layer 13. For example, the density of the anode leading-out region 15 can be set to a density that is the same as that of the buried layer 13. A common anode 21 is formed from the buried layer 13, the low-density layer 14, and the anode leading-out region 15.

Figure 9:
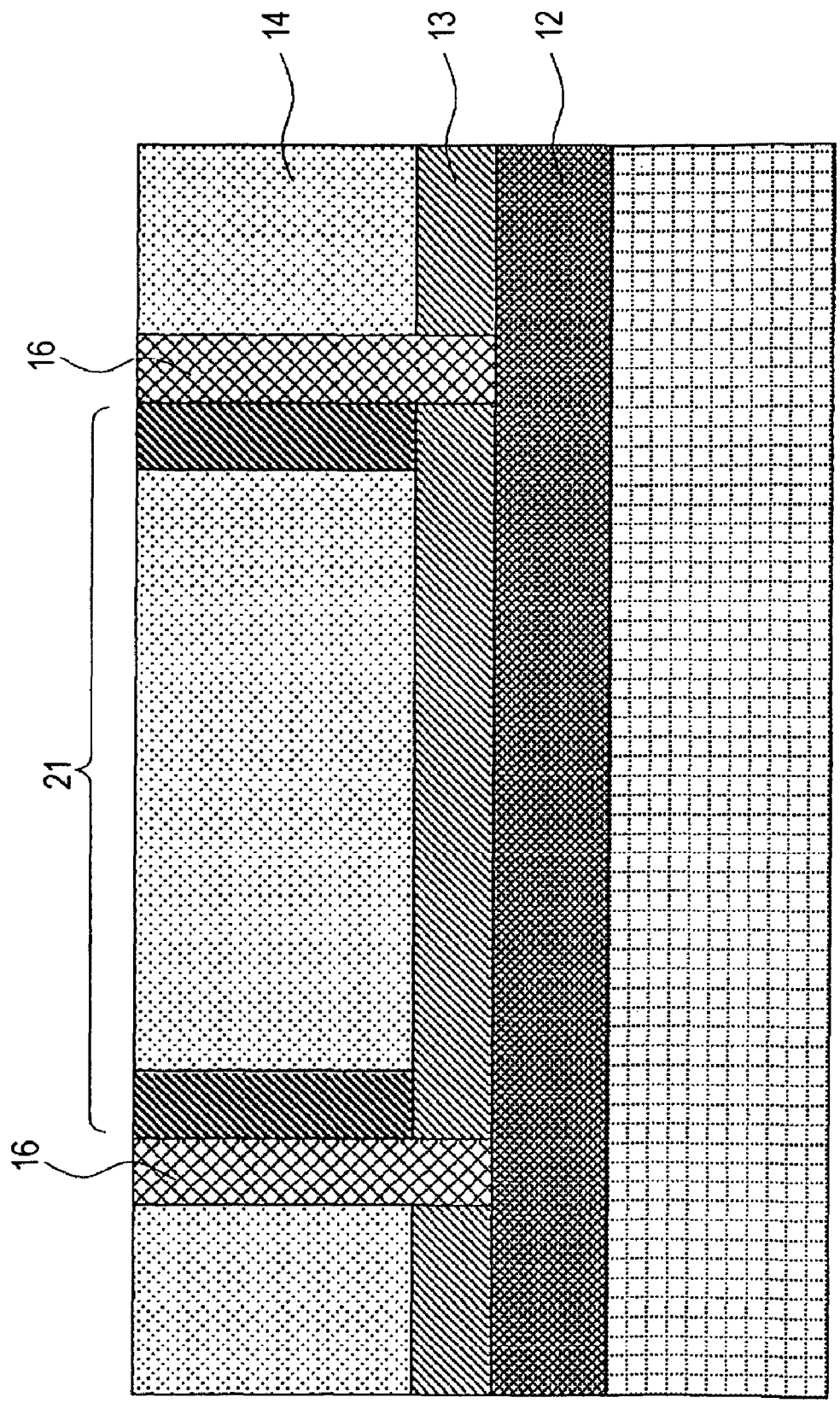
FIG. 9 is a cross-sectional view of a manufacturing process illustrating an example of an embodiment of the first method for manufacturing a semiconductor device according to the present invention.

Subsequently, as illustrated in FIG. 9, in order to isolate the common anode 21, an isolation region 16 is formed in the low-density layer 14 and the buried layer 13 so as to reach the insulating layer 12. For example, the isolation layer 16 is formed from deep trench isolation. For example, after an etching mask is formed in order to form a trench using a lithographic technique, a trench that reaches the insulating layer 12 is formed in the low-density layer 14 and the buried layer 13 by etching using the etching mask. Thereafter, an insulating layer is formed in the trench. An excess insulating layer formed on the low-density layer 14 is removed by, for example, chemical mechanical polishing (CMP). For example, silicon oxide can be used for the insulating layer. For instance, when silicon oxide is used for the insulating layer, an inner wall of the trench can be oxidized so as to form an oxidation layer. Thereafter, the inside of the trench can be filled with non-dope polysilicon or silicon oxide. In this way, the isolation region 16 is formed from the insulating layer formed inside the trench. Accordingly, one common anode 21 is electrically isolated from the neighboring common anode 21 and the semiconductor substrate 11 by the isolation region 16 and the insulating layer 12.

Figure 10:
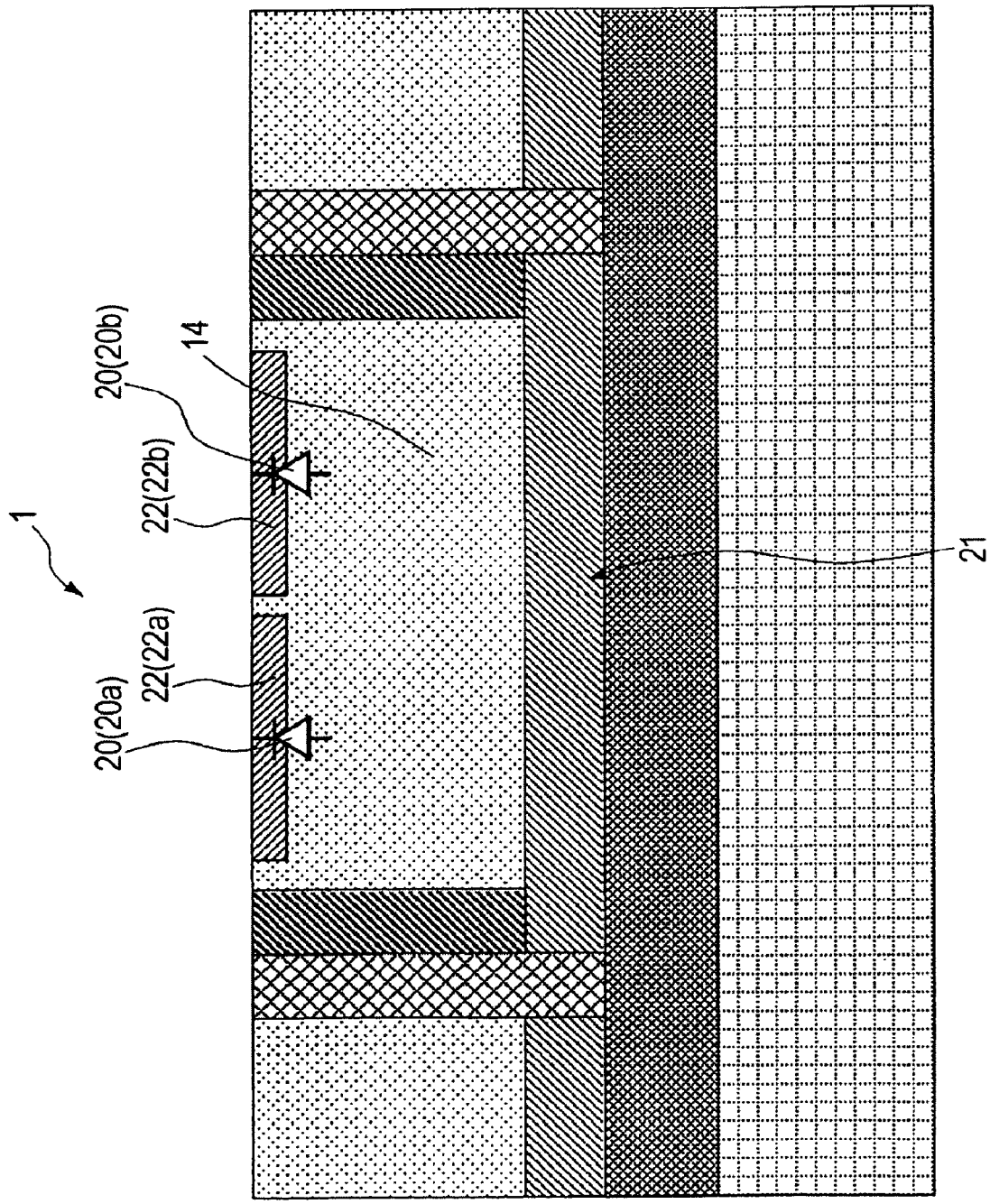
FIG. 10 is a cross-sectional view of a manufacturing process illustrating an example of an embodiment of the first method for manufacturing a semiconductor device according to the present invention.

Subsequently, as illustrated in FIG. 10, a plurality of cathodes 22 are formed in an upper portion of the low-density layer 14 of the common anode 21. The cathodes 22 are formed by, for example, introducing an N-type impurity into the upper layer of the low-density layer 14 using an ion implantation method so as to form an N-type layer. Note that when the ion implantation is performed, an ion implantation mask having an opening over an area where the cathodes 22 are formed is formed on the low-density layer 14 in advance. The implantation mask is removed after the ion implantation is performed. Also, note that, in the drawing, two cathodes 22a and 22b are formed for one common anode 21. However, three, four or more cathodes 22 (not shown) may be formed. In this way, by forming a plurality of the cathodes 22 for the common anode 21, the semiconductor device 1 including a plurality of the photodiodes 20 (20a) and 20 (20b) illustrated in FIG. 1 can be achieved.

According to the first method for manufacturing a semiconductor device, the buried layer 13 and the low-density layer 14 serving as the common anode 21 are formed on the insulating layer 12 formed on the semiconductor substrate 11. Additionally, the isolation region 16 is formed so as to reach the insulating layer 12. Accordingly, the insulating layer 12 and the isolation region 16 form the buried layer 13 and the low-density layer 14 that are electrically independent from the semiconductor substrate 11. The formed buried layer 13 and the low-density layer 14 serve as the common anode 21. Therefore, since the cathodes 22 and the common anode 21 of a plurality of photodiodes can be formed so as to be electrically independent from the semiconductor substrate 11, a configuration can be achieved in which the outputs of the separate cathodes 22 can be used as signals for computation, for example, for focus tracking, and the output of the common anode 21 can be directly used as an RF signal without using a summing amplifier. Thus, the semiconductor device 1 including the photodiode that can reduce noise and improve the S/N ratio and the frequency range can be produced. In addition, since the need for forming a summing amplifier is eliminated, the configuration of the device can be simplified. Furthermore, the photodiode 20 can be manufactured so as to have a configuration in which the photodiode 20 is independent from the semiconductor substrate 11. Therefore, a configuration can be provided in which crosstalk among the photodiodes isolated by, for example, the isolation region 16 is prevented.

An example of an embodiment of a second method for manufacturing a semiconductor device according to the present invention is described next with reference to cross-sectional views of the manufacturing processes shown in FIGS. 11 to 15. FIGS. 11 to 15 illustrate an example of a method for manufacturing a semiconductor device including a plurality of photodiodes that are electrically isolated from a semiconductor substrate by using an SOI (Silicon on insulator). That is, a method for manufacturing the semiconductor device illustrated in FIG. 3 is described.

Figure 11:
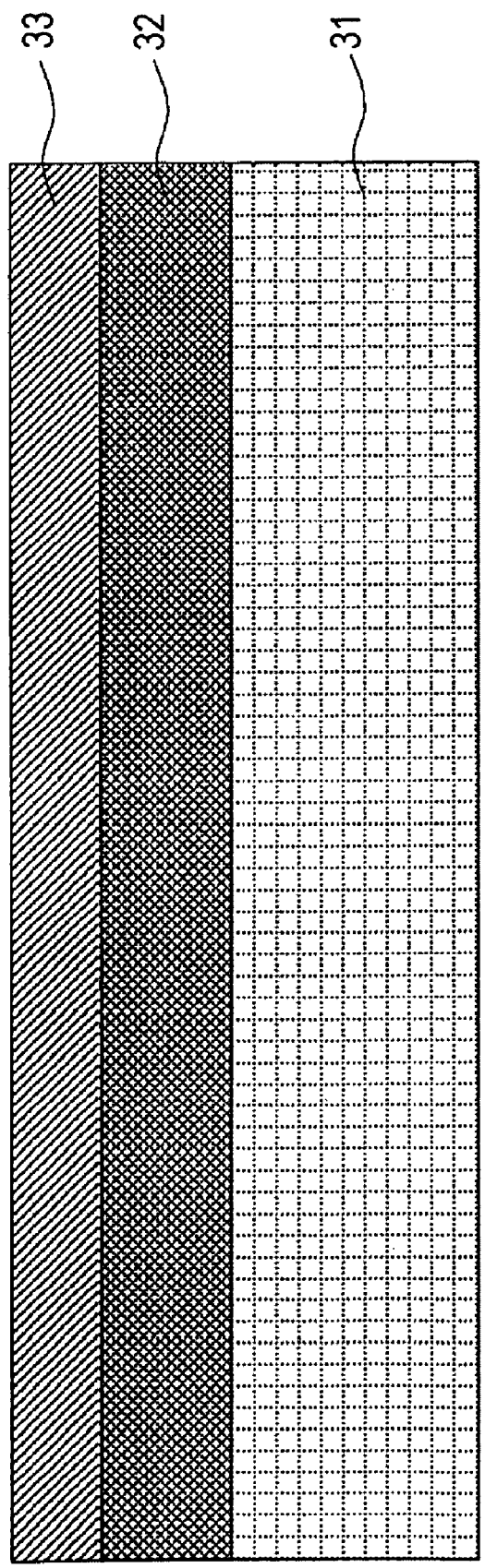
FIG. 11 is a cross-sectional view of a manufacturing process illustrating an example of an embodiment of a second method for manufacturing a semiconductor device according to the present invention.

As illustrated in FIG. 11, an SOI (Silicon on insulator) substrate is employed in which an insulating layer 32 is formed on a semiconductor substrate 31, and a silicon layer is formed on the insulating layer 32. The insulating layer 32 is formed from a silicon oxide film. An N-type impurity is introduced into the silicon layer. This silicon layer is used as an N+ type buried layer 33. For example, the buried layer 33 is formed by introducing an N type impurity so that the impurity density of the buried layer 33 is higher than or equal to $1 \times 10^{16}/cm^3$ and lower than or equal to $1 \times 10^{22}/cm^3$. For example, the N-type impurity is introduced so that the density is about $1 \times 10^{19}/cm^3$. By setting the impurity density of the buried layer 33 serving as a high density region in such a manner, the electrical resistance of the buried layer 33 can be decreased and the frequency characteristics can be extended.

Figure 12:
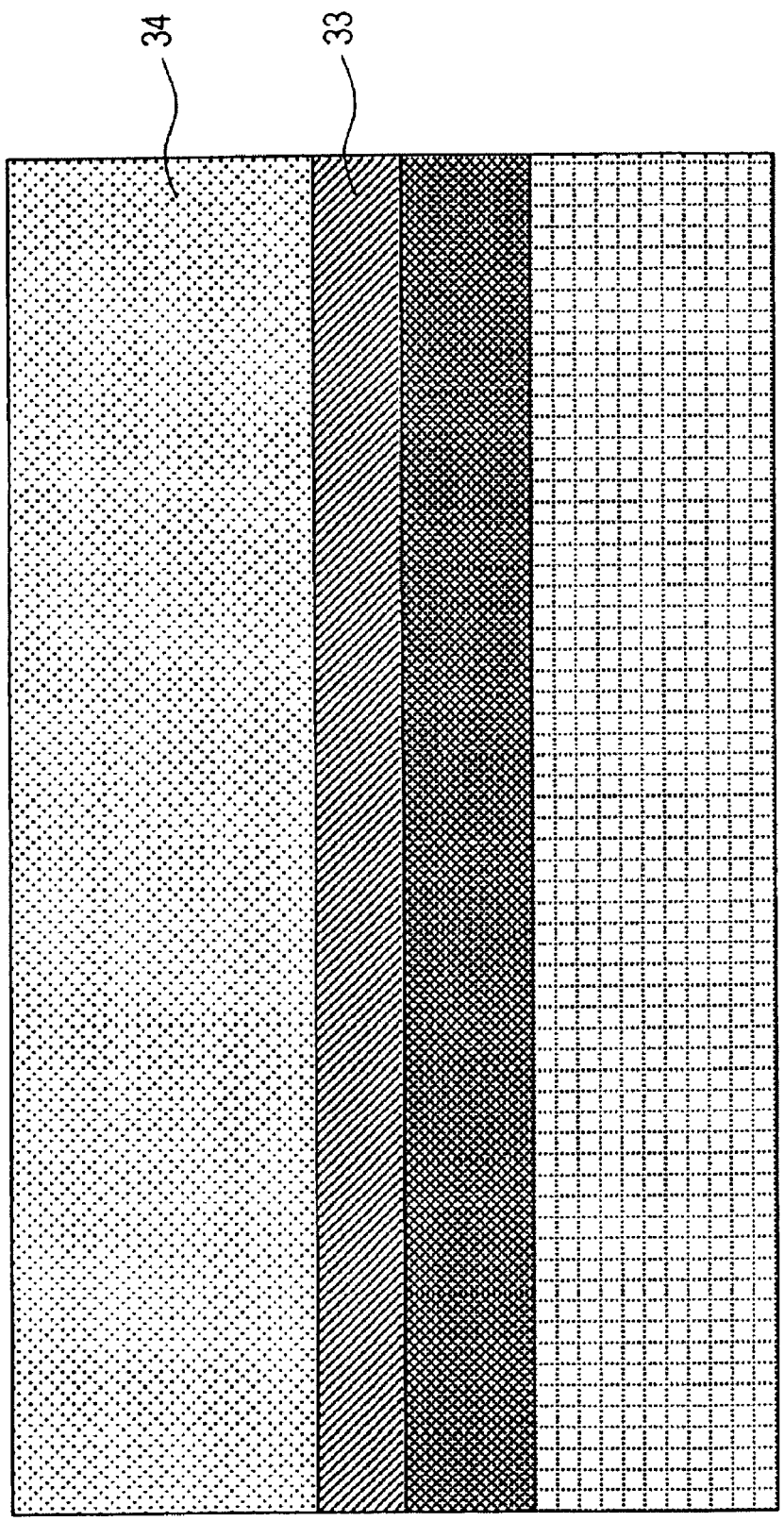
FIG. 12 is a cross-sectional view of a manufacturing process illustrating an example of an embodiment of the second method for manufacturing a semiconductor device according to the present invention.

Subsequently, as illustrated in FIG. 12, a low-density layer 34 is formed on the buried layer 33. The low-density layer 34 is an N− type silicon layer formed by using, for example, epitaxial growth. The density of the low-density layer 34 is lower than that of the buried layer 33. The impurity density of the low-density layer 34 is set to a value higher than or equal to $1 \times 10^{11}/cm^3$ and lower than or equal to $1 \times 10^{16}/cm^3$. For example, the low-density layer 34 is formed by depositing an N-type epitaxial layer having a thickness of 20 μm so as to have a value of about 700 Ω·cm. In addition, by setting the impurity density of the low-density layer 34 in such a manner, the impurity density can be decreased and a depletion layer can be easily expanded. Thus, the frequency characteristics can be improved and the light receiving sensitivity can be improved due to a decrease in capacitance. Furthermore, it is desirable that the thickness of a semiconductor region formed from the buried layer 33 and the low-density layer 34 is greater than the optical-absorption length. Thus, a structure having a high light receiving sensitivity of a photodiode can be achieved. This structure is described below.

Figure 13:
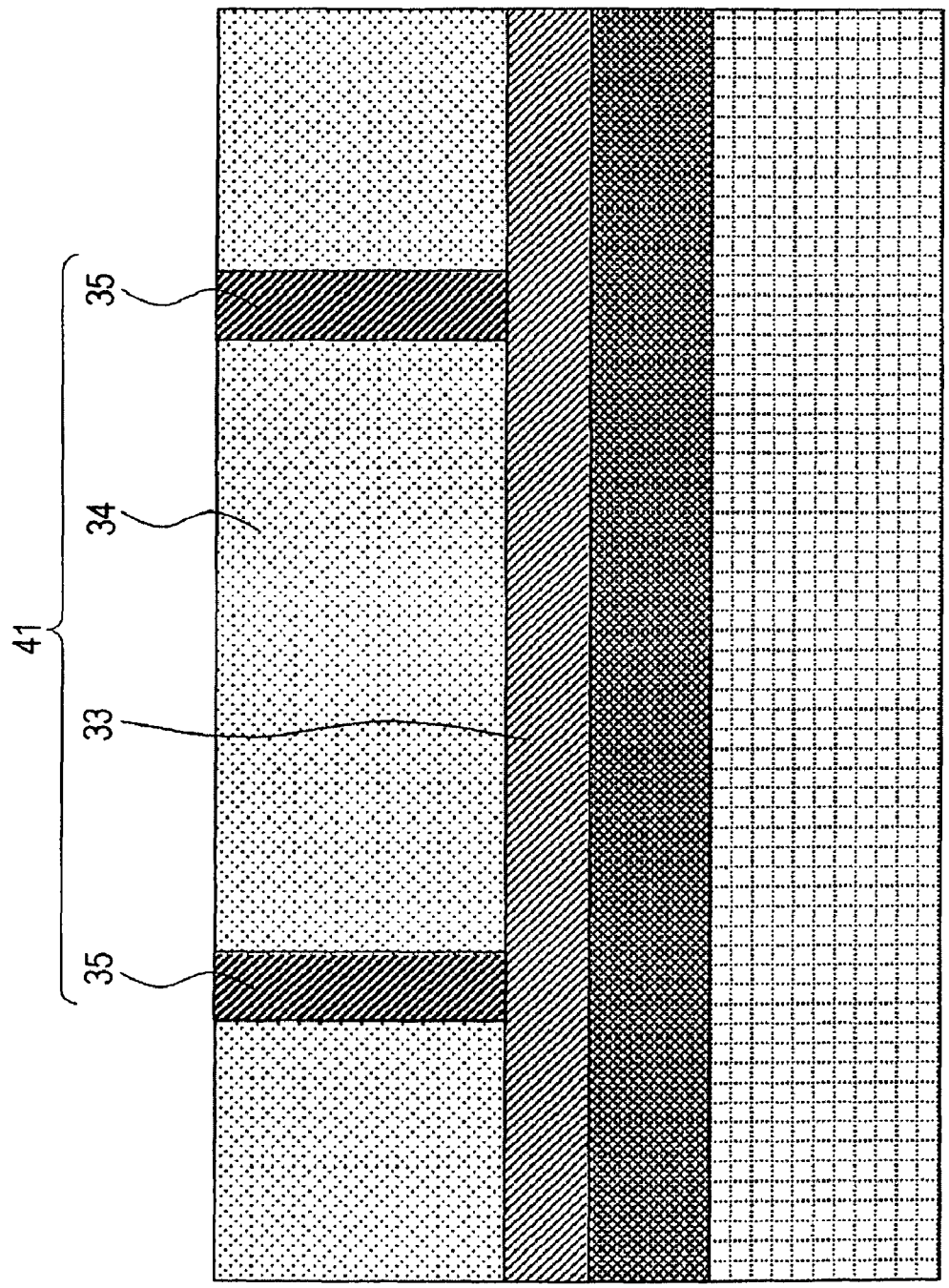
FIG. 13 is a cross-sectional view of a manufacturing process illustrating an example of an embodiment of the second method for manufacturing a semiconductor device according to the present invention.

Thereafter, as illustrated in FIG. 13, a cathode leading-out region 35 is formed in the low-density layer 34 so as to reach the buried layer 33. The cathode leading-out region 35 is formed from, for example, an N impurity layer having a density higher than that of the low-density layer 33. For example, the density of the cathode leading-out region 35 can be set to a density that is the same as that of the buried layer 33. A common cathode 41 is formed from the buried layer 33, the low-density layer 34, and the cathode leading-out region 35.

Figure 14:
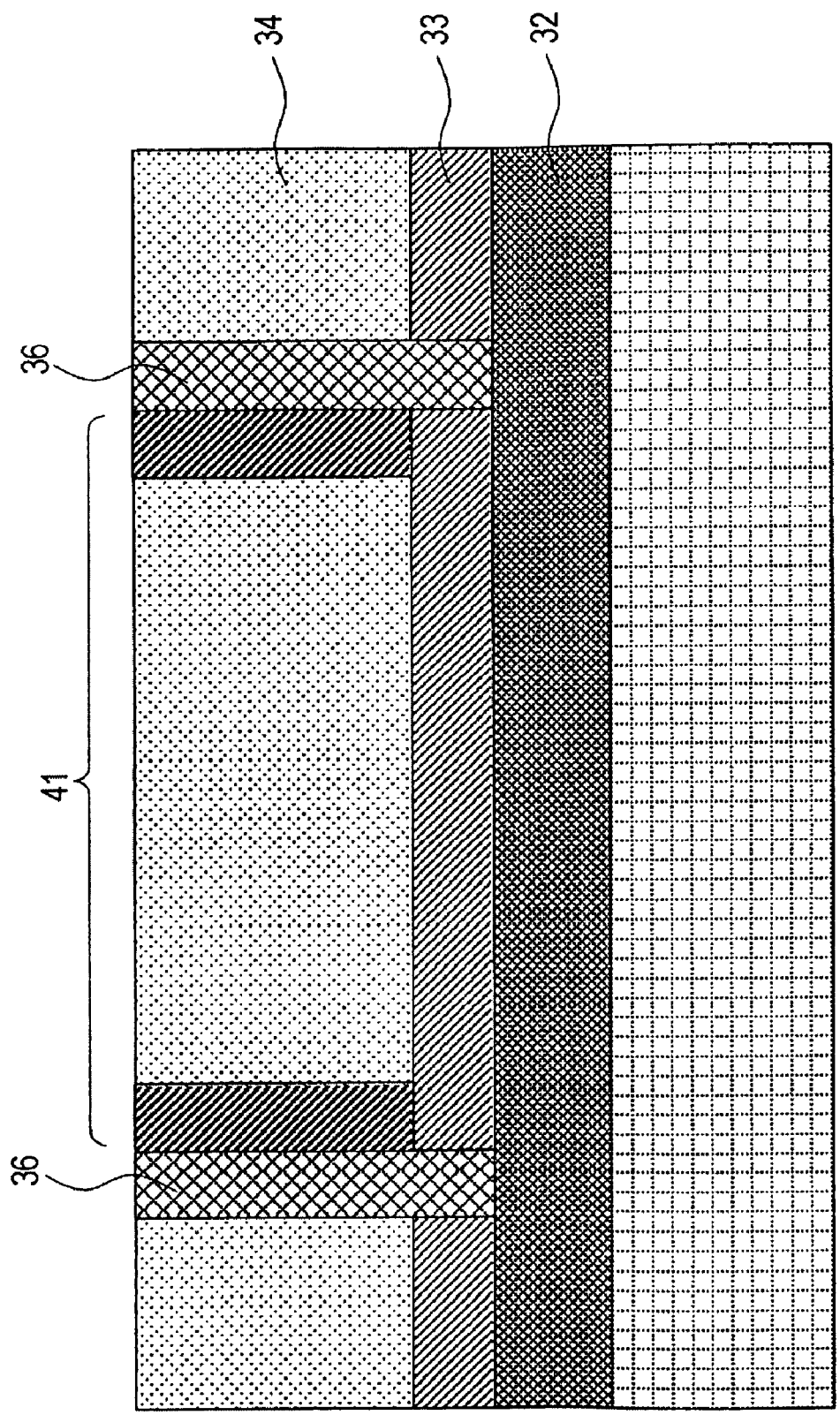
FIG. 14 is a cross-sectional view of a manufacturing process illustrating an example of an embodiment of the second method for manufacturing a semiconductor device according to the present invention.

Subsequently, as illustrated in FIG. 14, in order to isolate the common cathode 41, an isolation region 36 is formed in the low-density layer 34 and the buried layer 33 so as to reach the insulating layer 32. For example, the isolation layer 36 is formed from deep trench isolation. For example, after an etching mask is formed in order to form a trench using a lithographic technique, a trench that reaches the insulating layer 32 is formed in the low-density layer 34 and the buried layer 33 by etching using the etching mask. Thereafter, an insulating layer is formed in the trench. An excess insulating layer formed on the low-density layer 34 is removed by, for example, chemical mechanical polishing (CMP). For example, silicon oxide can be used for the insulating layer. For instance, when silicon oxide is used for the insulating layer, an inner wall of the trench can be oxidized so as to form an oxidation layer. Thereafter, the inside of the trench can be filled with non-dope polysilicon or silicon oxide. In this way, the isolation region 36 is formed from the insulating layer formed inside the trench. Accordingly, one common cathode 41 is electrically isolated from the neighboring common cathode 41 and the semiconductor substrate 31 by the isolation region 36 and the insulating layer 32.

Figure 15:
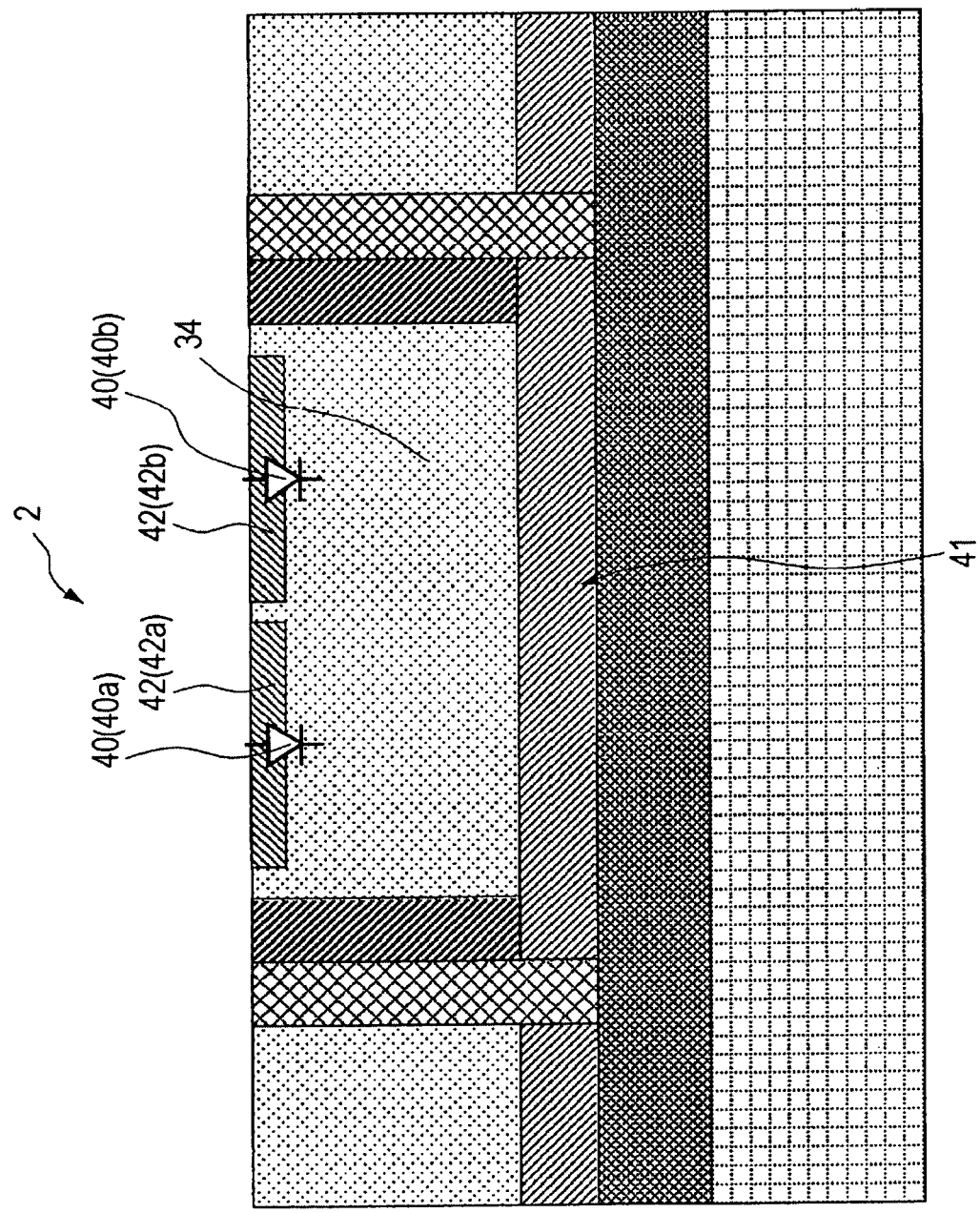
FIG. 15 is a cross-sectional view of a manufacturing process illustrating an example of an embodiment of the second method for manufacturing a semiconductor device according to the present invention.

Subsequently, as shown in FIG. 15, a plurality of anodes 42 are formed in an upper portion of the low-density layer 34 of the common cathode 41. The anodes 42 are formed by, for example, introducing a P-type impurity into the upper layer of the low-density layer 34 using an ion implantation method so as to form a P-type layer. Note that when the ion implantation is performed, an ion implantation mask having an opening over an area where the anodes 42 are formed is formed on the low-density layer 34 in advance. The implantation mask is removed after the ion implantation is performed. Also, note that, in the drawing, two anodes 42 (42a) and 42 (42b) are formed for one common cathode 41. However, three, four or more anodes 42 (not shown) may be formed. In this way, by forming the anodes 42 for the common cathode 41, the semiconductor device 2 including a plurality of the photodiodes 40a and 40b illustrated in FIG. 3 can be achieved.

According to the second method for manufacturing a semiconductor device, the buried layer 33 and the low-density layer 34 serving as the common cathode 41 are formed on the insulating layer 32 formed on the semiconductor substrate 31. Additionally, the isolation region 36 is formed so as to reach the insulating layer 32. Accordingly, the insulating layer 32 and the isolation region 36 form the buried layer 33 and the low-density layer 34 that are electrically independent from the semiconductor substrate 31. The formed buried layer 33 and the low-density layer 34 serve as the common cathode 41. Therefore, since the anodes 42 and the common cathode 41 of a plurality of photodiodes can be formed so as to be electrically independent from the semiconductor substrate 31, a configuration can be achieved in which the outputs of the separate anodes 42 can be used as signals for computation for, for example, focus tracking, and the output of the common cathode 41 can be directly used as an RF signal without using a summing amplifier. Thus, the semiconductor device 2 including the photodiode that can reduce noise and improve the S/N ratio and the frequency range can be produced. In addition, since the need for forming an existing summing amplifier is eliminated, the configuration of the device can be simplified. Furthermore, the photodiode 40 can be manufactured so as to have a configuration in which the photodiode 40 is independent from the semiconductor substrate 31. Therefore, a configuration can be provided in which crosstalk among the photodiodes isolated by, for example, the isolation region 36 is prevented.

An example of an embodiment of a third method for manufacturing a semiconductor device according to the present invention is described next with reference to cross-sectional views of the manufacturing processes shown in FIGS. 16 to 19. FIGS. 16 to 19 illustrate an example of a method for manufacturing a semiconductor device including a plurality of photodiodes that are electrically isolated from a semiconductor substrate by using a PN junction. That is, a method for manufacturing the semiconductor device illustrated in FIG. 4 is described.

Figure 16:
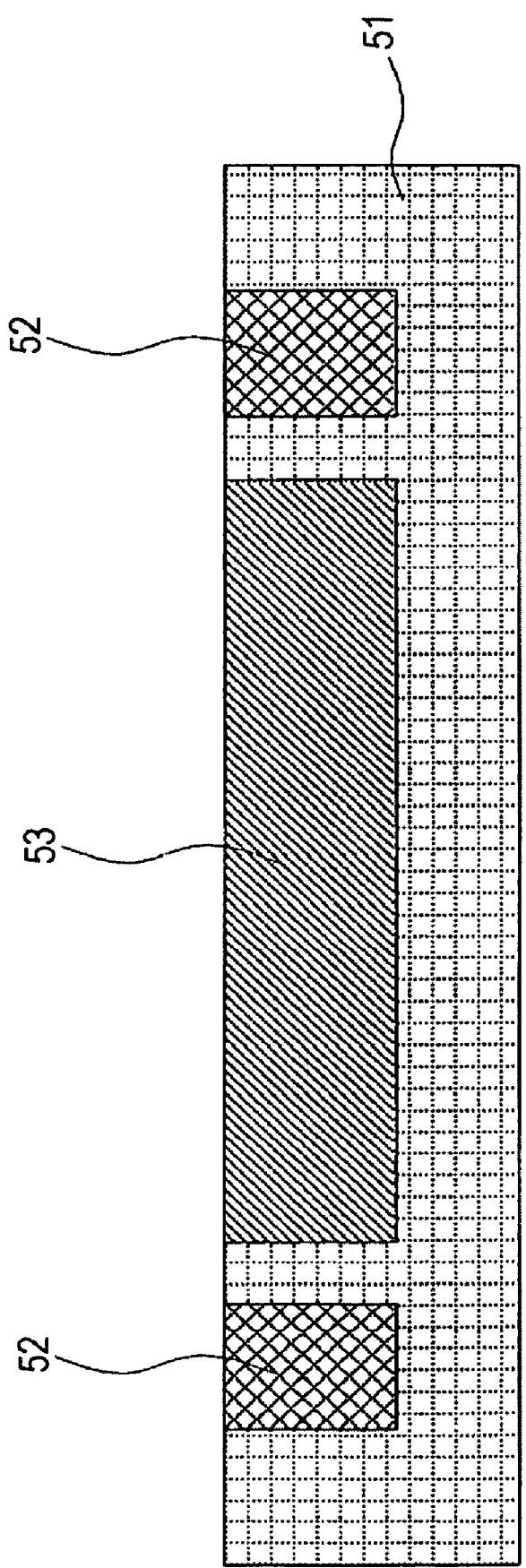
FIG. 16 is a cross-sectional view of a manufacturing process illustrating an example of an embodiment of a third method for manufacturing a semiconductor device according to the present invention.

As illustrated in FIG. 16, a lower layer 52 of an isolation region composed of an N+ type impurity layer is formed in an upper portion of an N− type semiconductor substrate 51. For example, the lower layer 52 of the isolation region can be formed using an ion implantation method. In addition, a P+ type buried layer 53 is formed in the upper portion of the semiconductor substrate 51 that is segmented and separated by the lower layer 52 of the isolation region. For example, the P+ type buried layer 53 can be formed using an impurity doping technique, such as an impurity diffusion method or the ion implantation method. The impurity density of the buried layer 53 is set to a value higher than or equal to $1 \times 10^{16}/cm^3$ and lower than or equal to $1 \times 10^{22}/cm^3$. By setting the impurity density of the buried layer 53 serving as a high density region in such a manner, the electrical resistance of the buried layer 53 can be decreased and the frequency characteristics can be extended.

Figure 17:
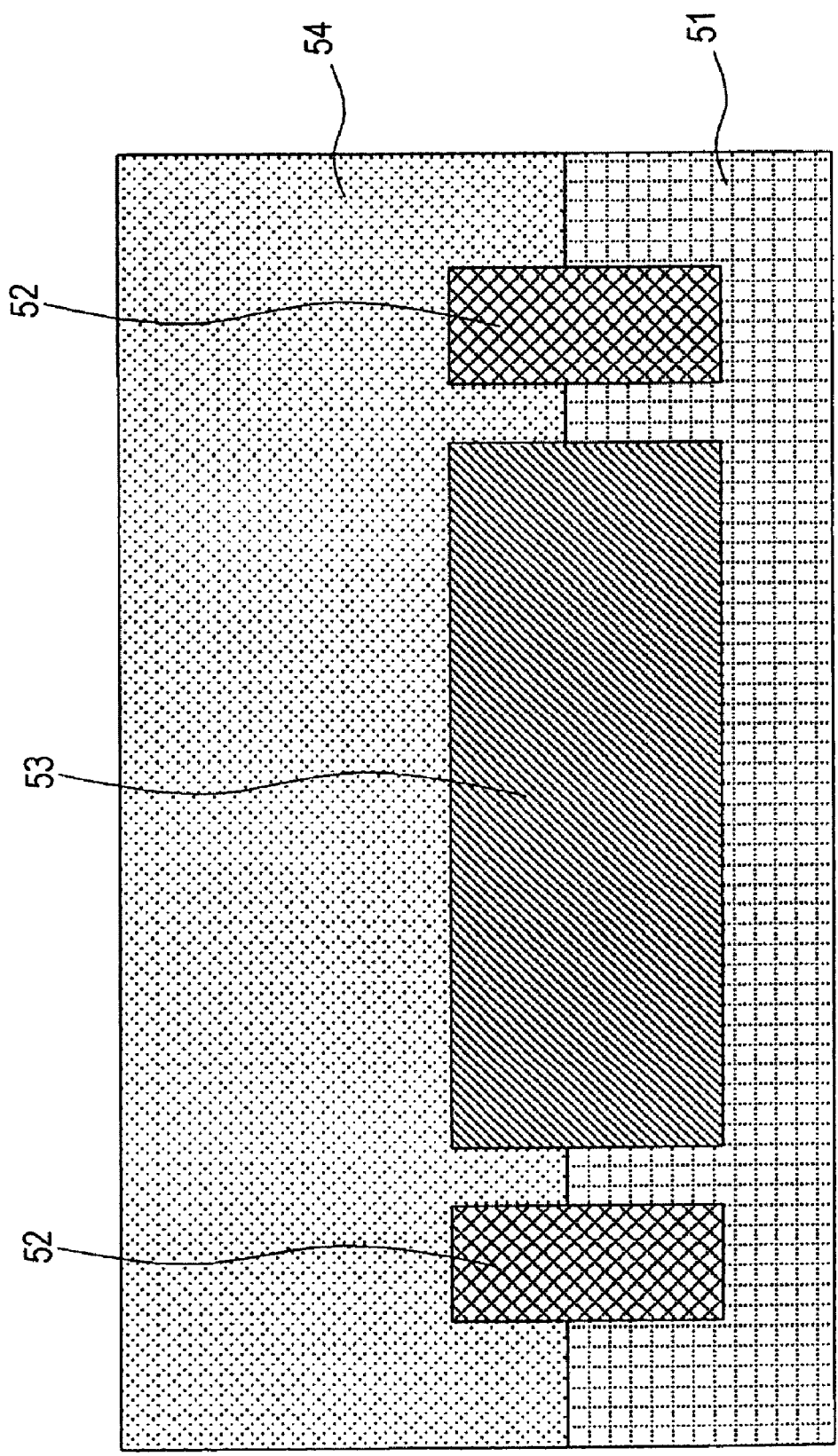
FIG. 17 is a cross-sectional view of a manufacturing process illustrating an example of an embodiment of the third method for manufacturing a semiconductor device according to the present invention.

Subsequently, as illustrated in FIG. 17, a P− type low-density layer 54 is formed on the semiconductor substrate 51. The density of the low-density layer 54 is lower than that of the buried layer 53. The low-density layer 54 is formed using, for example, an epitaxial growth method. The impurity density of the low-density layer 54 is set to a value higher than or equal to $1 \times 10^{11}/cm^3$ and lower than or equal to $1 \times 10^{16}/cm^3$. By setting the impurity density of the low-density layer 54 in such a manner, the impurity density can be decreased and a depletion layer can be easily expanded. Thus, the frequency characteristics can be improved and the light receiving sensitivity can be improved due to a decrease in capacitance. In addition, it is desirable that the thickness of the buried layer 53 is greater than the optical-absorption length. Thus, a structure having a high light receiving sensitivity of a photodiode can be achieved. This structure is described below. In addition, in the epitaxial growth, the impurities of the lower layer 52 of the isolation region and the buried layer 53 that have already been formed are diffused in the low-density layer 54, and therefore, the impurities extend into the low-density layer 54.

Figure 18:
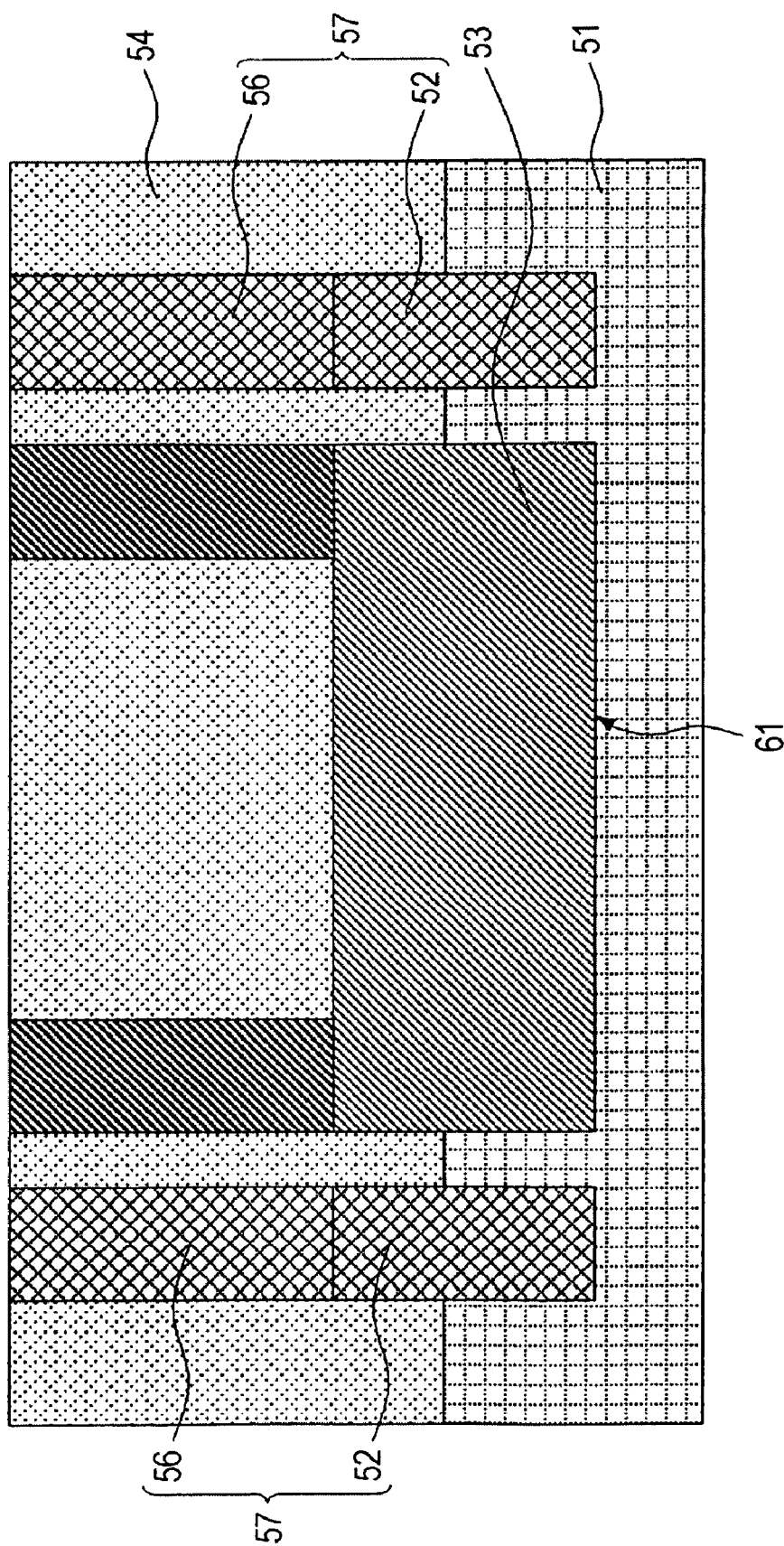
FIG. 18 is a cross-sectional view of a manufacturing process illustrating an example of an embodiment of the third method for manufacturing a semiconductor device according to the present invention.

Subsequently, as illustrated in FIG. 18, an anode leading-out region 55 is formed in the low-density layer 54 so as to reach the buried layer 53. The anode leading-out region 55 can be formed using, for example, an ion implantation method. The anode leading-out region 55 is a P-type impurity layer having a density higher than that of the low-density layer 54. For example, the density of the P-type impurity layer can be set to a density that is the same as that of the buried layer 53. In this way, a common anode 61 is formed from the buried layer 53, the low-density layer 54, and the anode leading-out region 55. In addition, an upper layer 56 of the isolation region that reaches the lower layer 52 of the isolation region is formed in the low-density layer 54. For example, the upper layer 56 of the isolation region can be formed using an ion implantation method. The upper layer 56 is formed from an N+ type impurity layer having a high density that is the same as that of the lower layer 52 of the isolation region. Thus, a PN junction type isolation region 57 can be formed from the lower layer 52 and the upper layer 56 of the isolation region.

Accordingly, the common anode 61 is isolated by the semiconductor substrate 51 and the isolation region 57 using a PN junction.

Figure 19:
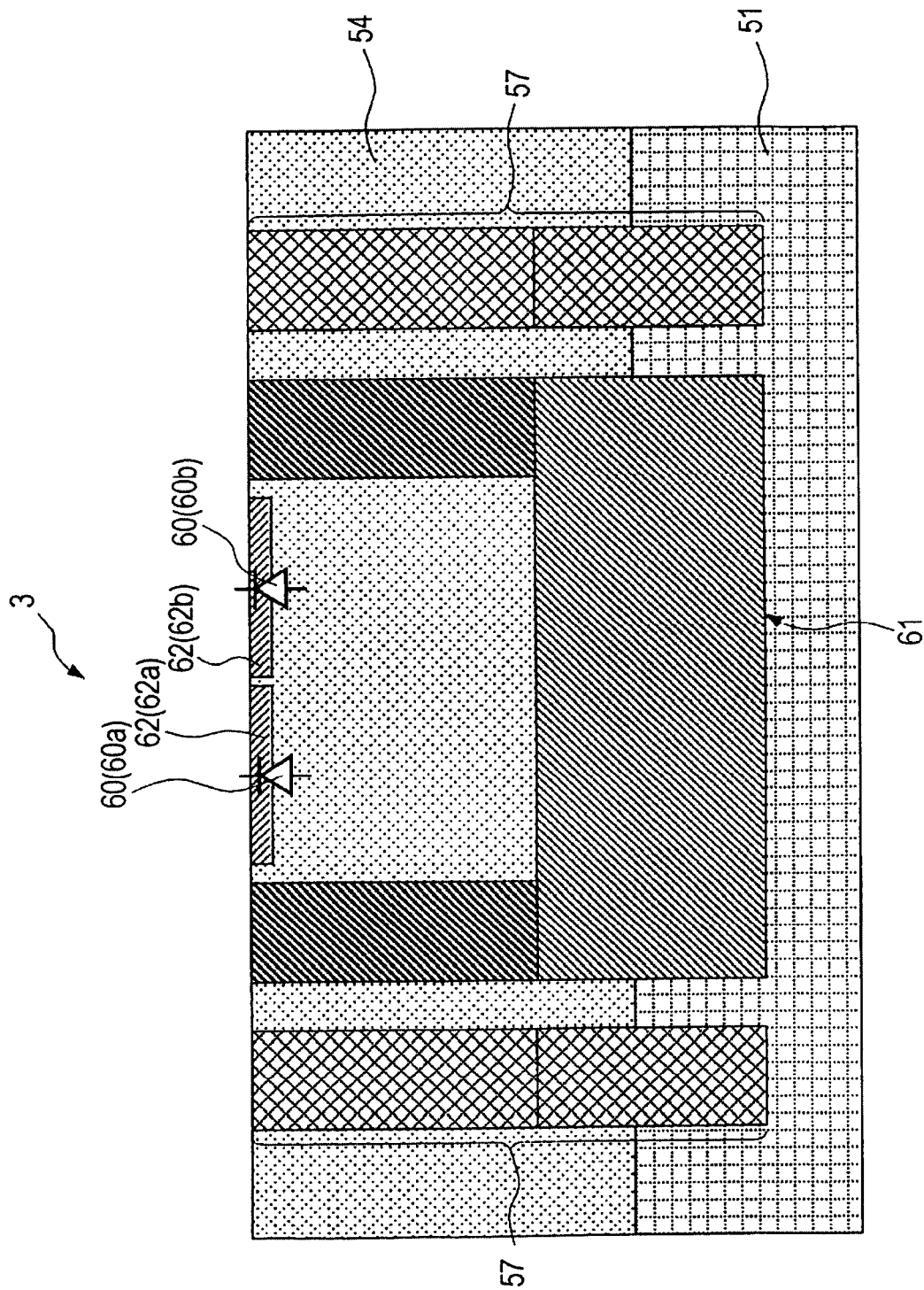
FIG. 19 is a cross-sectional view of a manufacturing process illustrating an example of an embodiment of the third method for manufacturing a semiconductor device according to the present invention.

Subsequently, as illustrated in FIG. 19, a plurality of cathodes 62 are formed in an upper portion of the low-density layer 54 of the common anode 61. The cathodes 62 are formed by introducing N-type impurities into the upper layer of the low-density layer 54 using, for example, an ion implantation method. Note that when the ion implantation is performed, an ion implantation mask having an opening over an area where the cathodes 62 are formed is formed on the low-density layer 54 in advance. The implantation mask is removed after the ion implantation is performed. Also, note that, in the drawing, two cathodes 62a and 62b are formed for one common anode 61. However, three, four or more cathodes 62 (not shown) may be formed. In this way, by forming a plurality of the cathodes 62 for the common anode 61, the semiconductor device 3 including a plurality of the photodiodes 60 (60a) and 60 (60b) illustrated in FIG. 4 can be achieved.

As described above, by isolating the common anode 61 using the isolation region 57 employing a PN junction, the photodiodes 60 can be completely electrically insulated and isolated from the semiconductor substrate 51. Thus, the output of the common anode 61 of the photodiodes 60 can be obtained as a sum signal of the photodiodes having the separate cathodes 62.

According to the third method for manufacturing a semiconductor device, the PN-junction type isolation region 57 that reaches the semiconductor substrate 51 is formed in the low-density layer 54 formed on the semiconductor substrate 51. Accordingly, the cathodes 62 and the common anode 61 of a plurality of the photodiodes 60 are formed so as to be electrically independent from the semiconductor substrate. Accordingly, a configuration can be obtained in which the outputs of the separate cathodes 62 can be used as signals for computation for, for example, focus tracking, and the output of the common anode 61 can be directly used as an RF signal without using a summing amplifier. Thus, the semiconductor device 3 including the photodiode that can reduce noise and improve the S/N ratio and the frequency range can be produced. In addition, since the need for forming an existing summing amplifier is eliminated, the configuration of the device can be simplified. Furthermore, the photodiode 60 can be manufactured so as to have a configuration in which the photodiode 60 is independent from the semiconductor substrate 51. Therefore, a configuration can be provided in which crosstalk among the photodiodes isolated by, for example, the isolation region 57 is prevented.

An example of an embodiment of a fourth method for manufacturing a semiconductor device according to the present invention is described next with reference to cross-sectional views of the manufacturing processes shown in FIGS. 20 to 23. FIGS. 20 to 23 illustrate an example of a method for manufacturing a semiconductor device including a plurality of photodiodes that are electrically isolated from a semiconductor substrate by using a PN junction. That is, a method for manufacturing the semiconductor device illustrated in FIG. 5 is described.

Figure 20:
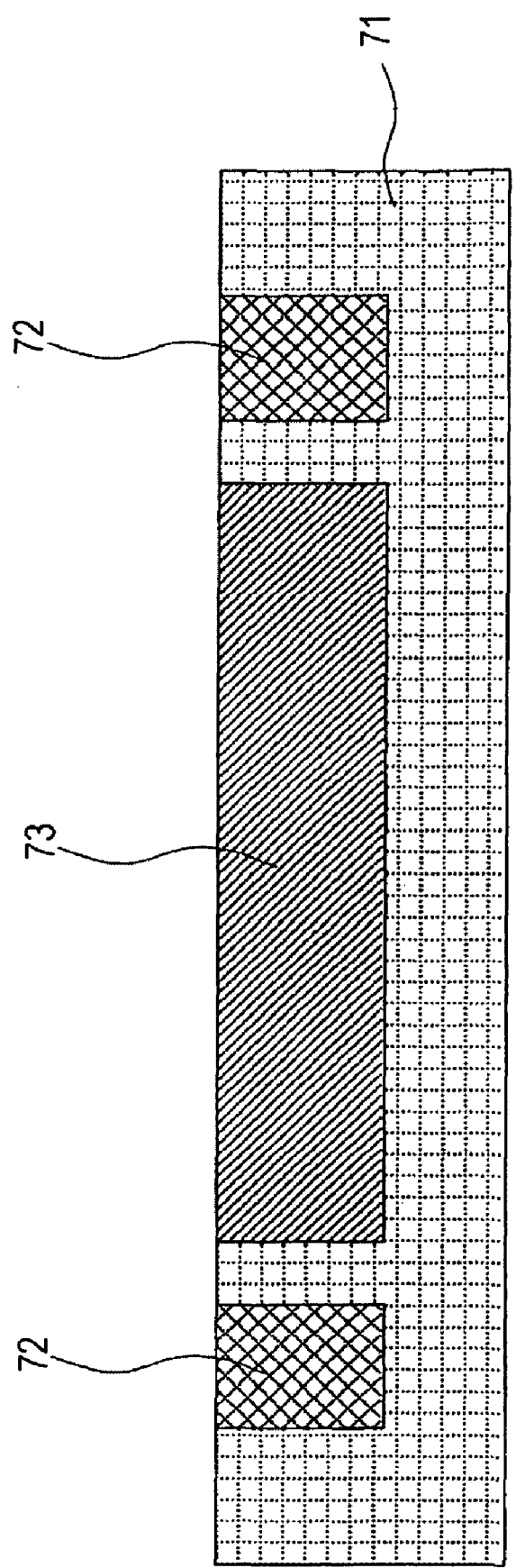
FIG. 20 is a cross-sectional view of a manufacturing process illustrating an example of an embodiment of a fourth method for manufacturing a semiconductor device according to the present invention.

As illustrated in FIG. 20, a lower layer 72 of an isolation region composed of a P+ type impurity layer is formed in an upper portion of a P− type semiconductor substrate 71. For example, the lower layer 72 of the isolation region can be formed using an ion implantation method. In addition, an N+ type buried region 73 is formed in the upper portion of the semiconductor substrate 71 that is segmented and separated by the lower layer 72 of the isolation region. For example, the N+ type buried region 73 can be formed using an impurity doping technique, such as the impurity diffusion method or the ion implantation method. The impurity density of the buried region 73 is set to a value higher than or equal to $1 \times 10^{16}/cm^3$ and lower than or equal to $1 \times 10^{22}/cm^3$. By setting the impurity density of the buried region 73 serving as a high density region in such a manner, the electrical resistance of the buried region 73 can be decreased and the frequency characteristics can be extended.

Figure 21:
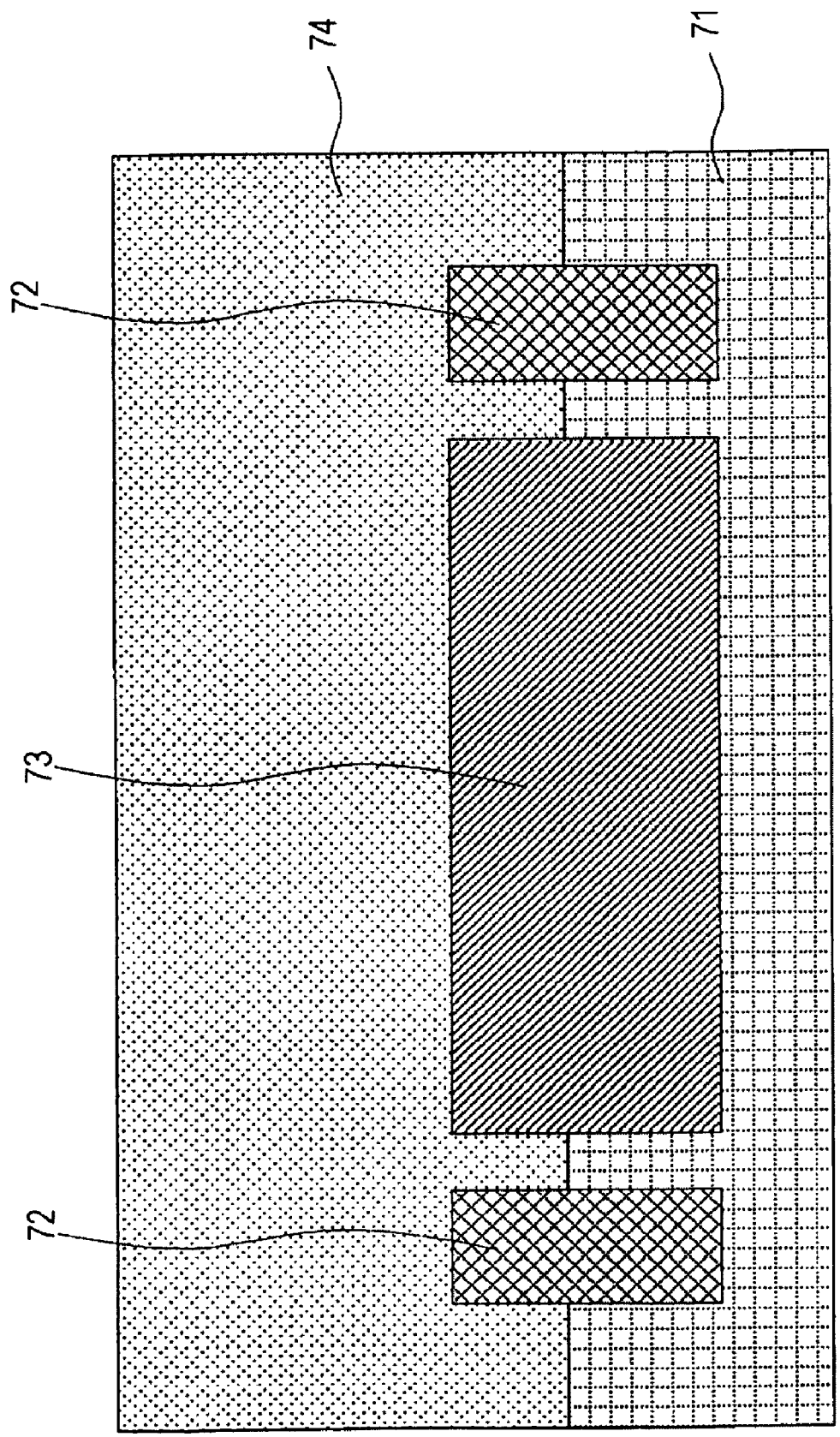
FIG. 21 is a cross-sectional view of a manufacturing process illustrating an example of an embodiment of the fourth method for manufacturing a semiconductor device according to the present invention.

Subsequently, as illustrated in FIG. 21, an N⁻ type low-density layer 74 is formed on the semiconductor substrate 71. The density of the low-density layer 74 is lower than that of the buried region 73. The low-density layer 74 is formed using, for example, an epitaxial growth method. The impurity density of the low-density layer 74 is set to a value higher than or equal to $1\times10^{11}/cm^3$ and lower than or equal to $1\times10^{16}/cm^3$. By setting the impurity density of the low-density layer 74 in such a manner, the impurity density can be decreased and a depletion layer can be easily expanded. Thus, the frequency characteristics can be improved and the light receiving sensitivity can be improved due to a decrease in capacitance. In addition, it is desirable that the thickness of the buried region 73 is greater than the optical-absorption length. Thus, a structure having a high light receiving sensitivity of a photodiode can be achieved. This structure is described below. In addition, in the epitaxial growth, the impurities of the lower layer 72 of the isolation region and the buried region 73 that have already been formed are diffused in the low-density layer 74, and therefore, the impurities extend into the low-density layer 74.

Figure 22:
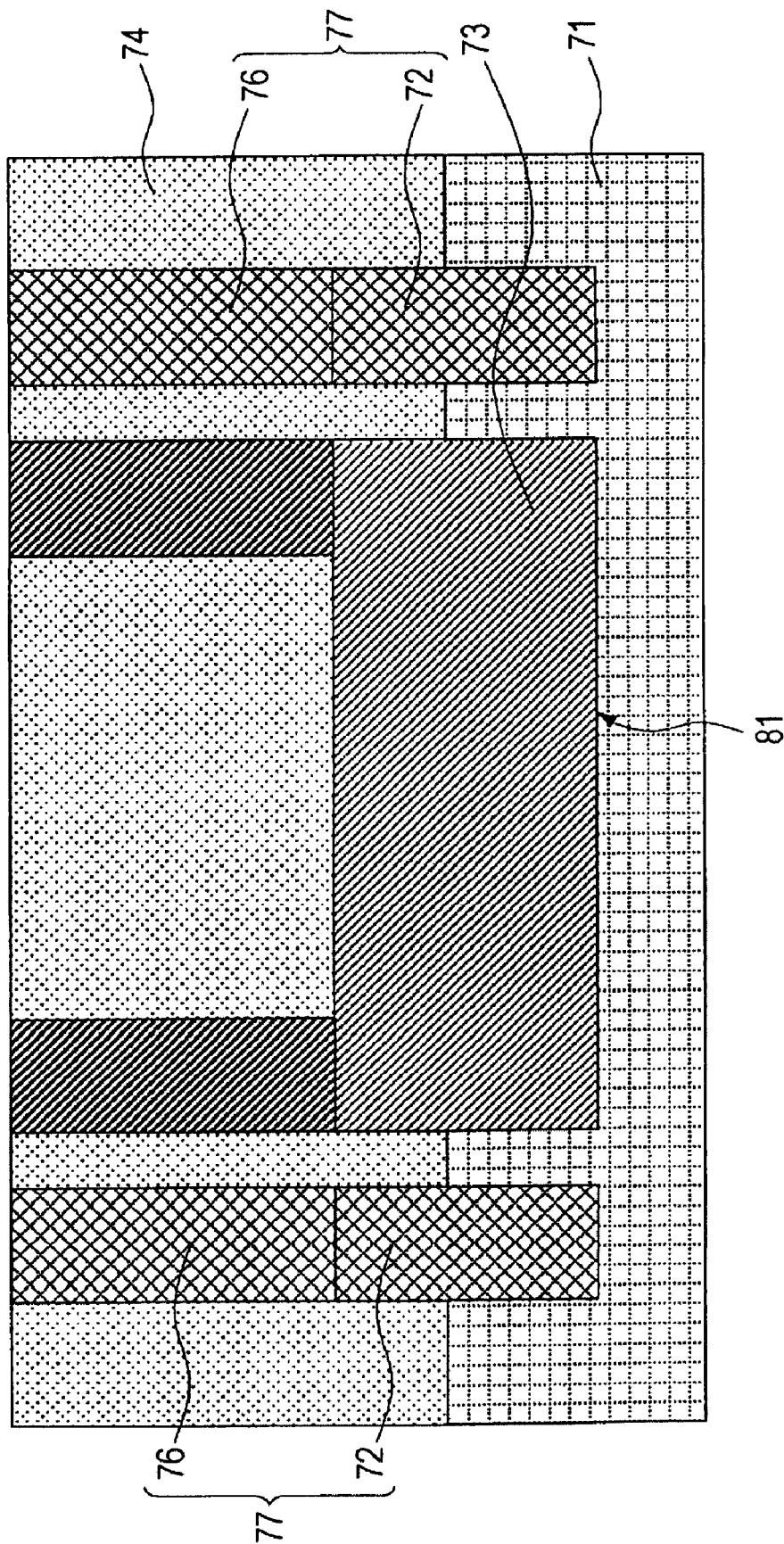
FIG. 22 is a cross-sectional view of a manufacturing process illustrating an example of an embodiment of the fourth method for manufacturing a semiconductor device according to the present invention.

Subsequently, as illustrated in FIG. 22, a cathode leading-out region 75 is formed in the low-density layer 74 so as to reach the buried region 73. The cathode leading-out region 75 can be formed using, for example, an ion implantation method. The cathode leading-out region 75 is an N-type impurity layer having a density higher than that of the low-density layer 73. For example, the density of the N-type impurity layer can be set to a density that is the same as that of the buried region 73. In this way, a common cathode 81 is formed from the buried region 73, the low-density layer 74, and the cathode leading-out region 75. In addition, an upper layer 76 of the isolation region that reaches the lower layer 72 of the isolation region is formed in the low-density layer 74. For example, the upper layer 76 of the isolation region can be formed using an ion implantation method. The upper layer 76 is formed from a P⁺ type impurity layer having a high density that is the same as that of the lower layer 72 of the isolation region. Thus, a PN junction type isolation region 77 can be formed from the lower layer 72 and the upper layer 76 of the isolation region.

Accordingly, the common cathode 81 is isolated by the semiconductor substrate 71 and the isolation region 77 using a PN junction.

Figure 23:
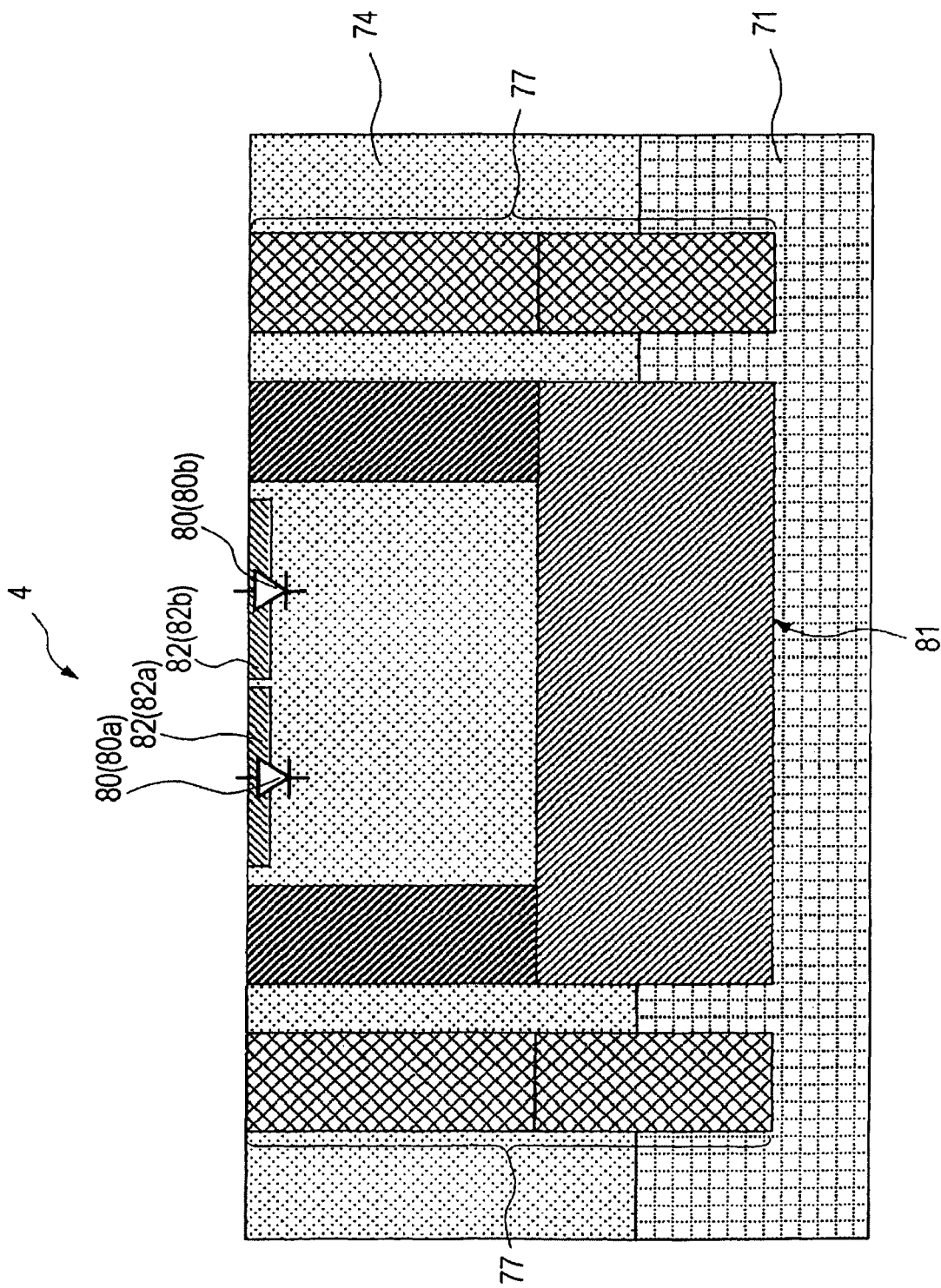
FIG. 23 is a cross-sectional view of a manufacturing process illustrating an example of an embodiment of the fourth method for manufacturing a semiconductor device according to the present invention.
Figure 24:
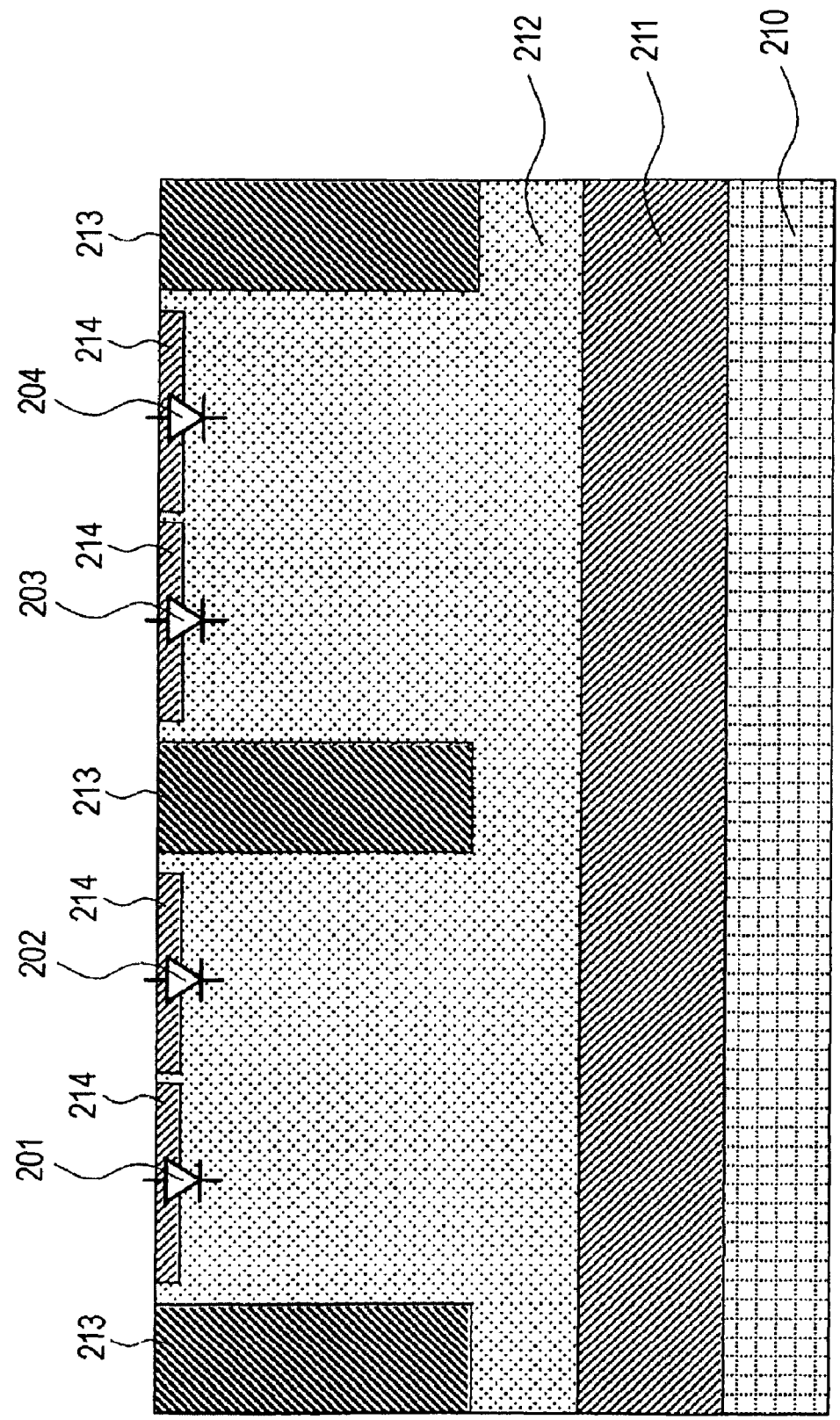
FIG. 24 is a cross-sectional view of a schematic configuration illustrating an example of an existing photodetector IC semiconductor device.
Figure 25:
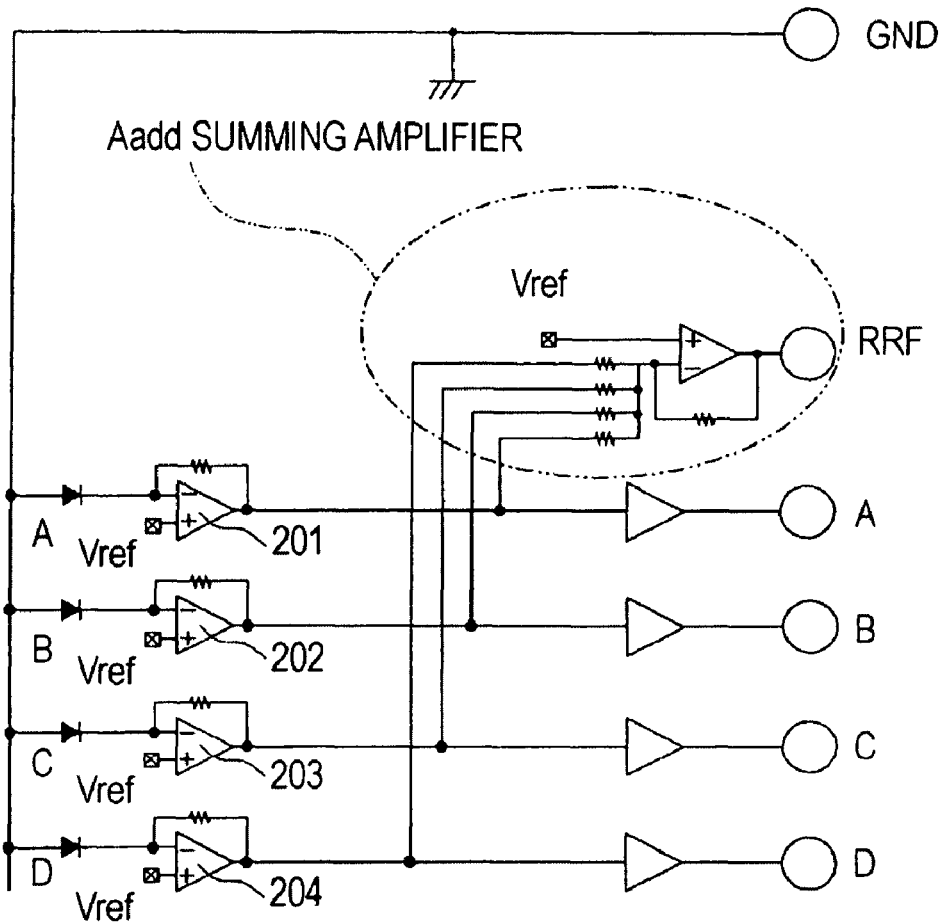
FIG. 25 is a circuit diagram illustrating an example of an existing photodiode integrated circuit.
Figure 26:
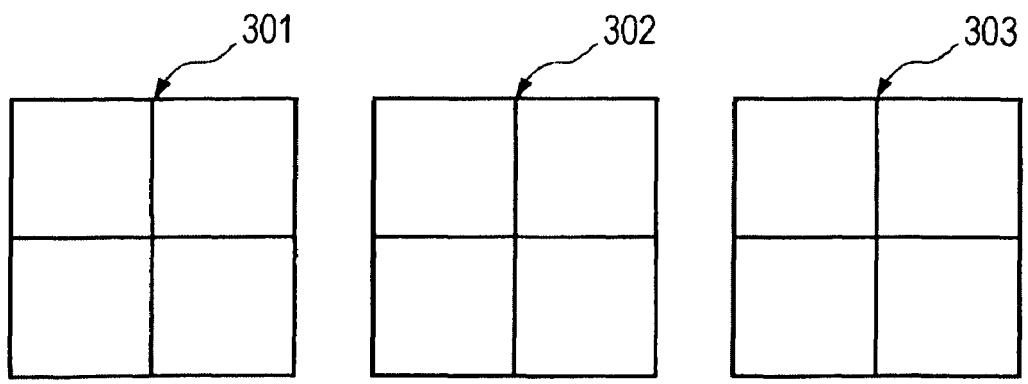
FIG. 26 is a layout diagram of photodiodes for illustrating crosstalk.

Subsequently, as illustrated in FIG. 23, a plurality of anodes 82 are formed in an upper portion of the low-density layer 74 of the common cathode 81. The anodes 82 are formed by introducing N-type impurities into the upper layer of the low-density layer 74 using, for example, an ion implantation method. Note that when the ion implantation is performed, an ion implantation mask having an opening over an area where the anodes 82 are formed is formed on the low-density layer 74 in advance. The implantation mask is removed after the ion implantation is performed. Also, note that, in the drawing, two anodes 82a and 82b are formed for one common cathode 81. However, three, four or more anodes 82 (not shown) may be formed. In this way, by forming a plurality of the anodes 82 for the common cathode 81, the semiconductor device 4 including a plurality of the photodiodes 80a and 80b illustrated in FIG. 5 can be achieved.

As described above, by isolating the common cathode 81 using the isolation region 77 employing a PN junction, the photodiodes 80 can be completely electrically insulated and isolated from the semiconductor substrate 71. Thus, the output of the common cathode 81 of the photodiodes 80 can be obtained as a sum signal of the photodiodes having the separate anodes 82.

According to the fourth method for manufacturing a semiconductor device, the PN-junction type isolation region 77 that reaches the semiconductor substrate 71 is formed in the low-density layer 74 formed on the semiconductor substrate 71. Accordingly, the anodes 82 and the common cathode 81 of a plurality of the photodiodes 80 are formed so as to be electrically independent from the semiconductor substrate. Accordingly, a configuration can be obtained in which the outputs of the separate anodes 82 can be used as signals for computation for, for example, focus tracking, and the output of the common cathode 81 can be directly used as an RF signal without using a summing amplifier. Thus, the semiconductor device 4 including the photodiode that can reduce noise and improve the S/N ratio and the frequency range can be produced. In addition, since the need for forming an existing summing amplifier is eliminated, the configuration of the device can be simplified. Furthermore, the photodiode 80 can be manufactured so as to have a configuration in which the photodiode 80 is independent from the semiconductor substrate 71. Therefore, a configuration can be provided in which crosstalk among the photodiodes isolated by, for example, the isolation region 77 is prevented.

In the above-described first to fourth manufacturing methods, a bipolar device (not shown) or a CMOS device (not shown) that is mounted on the semiconductor substrate 11, 31, 51, and 71 together with the photodiodes 20, 40, 60, and 80, respectively, can be formed using a widely used manufacturing method. The device may be formed after the photodiodes 20, 40, 60, or 80 are formed. In addition, when the device is formed, components that can be shared with components of the photodiodes 20, 40, 60, or 80 can be formed at a process time of the photodiodes 20, 40, 60, or 80.

According to a semiconductor device of the present invention, a cathode and an anode of a plurality of photodiodes are formed so as to be electrically independent from a semiconductor substrate. Accordingly, the outputs of the separate cathodes (or anodes) can be used as signals for computation for, for example, focus tracking, and the output of the common anode (or cathode) can be directly used as an RF signal without using a summing amplifier. Thus, noise can be advantageously reduced and the S/N ratio can be improved. In addition, since the photodiode can have a configuration in which the photodiode is independent from the semiconductor substrate, a configuration can be provided in which crosstalk among the photodiodes is prevented.

According to a method for manufacturing a semiconductor device of the present invention, a cathode and an anode of a plurality of photodiodes can be formed so as to be electrically independent from a semiconductor substrate. Accordingly, the outputs of the separate cathodes (or anodes) can be used as signals for computation, for example, for focus tracking, and the output of the common anode (or cathode) can be directly used as an RF signal without using a summing amplifier. Thus, noise can be advantageously reduced and the S/N ratio can be improved. In addition, since the photodiode can be manufactured so as to have a configuration in which the photodiode is independent from the semiconductor substrate, a configuration can be provided in which crosstalk among the photodiodes is prevented.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention claimed is:

1. A semiconductor device having a plurality of photodiodes on a semiconductor substrate, comprising cathodes and anodes of the plurality of photodiodes are formed so as to be electrically independent from the semiconductor substrate, the plurality of photodiodes have a common anode and a plurality of separate cathodes, and an output from the common anode is considered to be equivalent to a sum of outputs of the plurality of separate photodiodes, or in that the plurality of photodiodes have a common cathode and a plurality of separate anodes, and an output from the common cathode is considered to be equivalent to a sum of outputs of the plurality of separate photodiodes.

2. The semiconductor device according to claim 1, wherein the photodiodes are formed in a semiconductor layer of an SOI structure including a semiconductor layer formed on the semiconductor substrate with an insulating layer therebetween, the semiconductor layer is isolated into a plurality of pieces by trenches that reach the insulating layer, and the common anode and the plurality of cathodes are provided in the isolated semiconductor layer or the common cathode and the plurality of anodes are provided in the isolated semiconductor layer.

3. The semiconductor device according to claim 2, wherein the thickness of the semiconductor layer is greater than the optical-absorption length.

4. The semiconductor device according to claim 1, wherein one of a P-type semiconductor substrate and an N-type semiconductor substrate is used for the semiconductor substrate, the semiconductor device comprises a P-type buried layer formed on the semiconductor substrate with an insulating layer therebetween, a P-type low-density layer formed on the buried layer from a P-type layer having a density lower than that of the buried layer, and an N-type layer serving as the plurality of cathodes formed in an upper layer of the low-density layer, and in that an anode region formed by the low-density layer and the buried layer is segmented and isolated by an isolation region that reaches the semiconductor substrate, and the common anode is formed by the buried layer and the low-density layer segmented and isolated by the isolation region.

5. The semiconductor device according to claim 4, wherein the thickness of the buried layer is greater than the optical-absorption length.

6. The semiconductor device according to claim 1, the photodiodes receive reflected light reflected off an optical disk, the semiconductor device uses an output of the common anode as an RF signal, and the semiconductor device performs focus signal processing and tracking signal processing using outputs of the plurality of separate cathodes.

7. The semiconductor device according to claim 1, wherein one of an N-type semiconductor substrate and a P-type semiconductor substrate is used for the semiconductor substrate, the semiconductor device comprises an N-type buried layer formed on the semiconductor layer with an insulating layer therebetween, an N-type low-density layer formed on the buried layer from an N-type layer having a density lower than that of the buried layer, and a P-type layer serving as the plurality of anodes formed in an upper layer of the low-density layer, and in that a cathode region formed by the low-density layer and the buried layer is segmented and isolated by an isolation region that reaches the semiconductor substrate, and the common cathode is formed by the buried layer and the low-density layer segmented and isolated by the isolation region.

8. The semiconductor device according to claim 7, wherein the thickness of the buried layer is greater than the optical-absorption length.

9. The semiconductor device according to claim 1, wherein the photodiode is formed in a semiconductor layer formed on the semiconductor substrate and having a conductivity type that is opposite to that of the semiconductor substrate, the semiconductor layer is isolated into a plurality of pieces by a PN junction isolation that reaches the insulating layer, and in that the common anode and the plurality of cathodes are formed in the isolated semiconductor layer, or the common cathode and the plurality of anodes are formed in the isolated semiconductor layer.

10. The semiconductor device according to claim 9, wherein the thickness of the semiconductor layer is greater than the optical-absorption length.

11. The semiconductor device according to claim 1, wherein an N-type semiconductor substrate is used for the semiconductor substrate, the semiconductor device comprises a P-type low-density layer formed on the semiconductor substrate, a P-type buried layer formed from a P-type layer having a density higher than that of the low-density layer and formed in a lower portion of an anode region disposed between the semiconductor substrate and the low-density layer, and an N-type layer serving as the plurality of cathodes formed in an upper layer of the low-density layer, and in that the low-density layer serving as the anode region is segmented and isolated by an isolation region that reaches the semiconductor substrate, and the common anode is formed by the low-density layer and the buried layer segmented and isolated by the isolation region.

12. The semiconductor device according to claim 11, wherein the thickness of the buried layer is greater than the optical-absorption length.

13. The semiconductor device according to claim 1, wherein a P-type semiconductor substrate is used for the semiconductor substrate, the semiconductor device comprises an N-type low-density layer formed on the semiconductor substrate, an N-type buried layer formed from an N-type layer having a density higher than that of the low-density layer and formed in a lower portion of a cathode region disposed between the semiconductor substrate and the low-density layer, and a P-type layer serving as the plurality of anodes formed in an upper layer of the low-density layer, and in that the low-density layer serving as the cathode region is segmented and isolated by an isolation region that reaches the semiconductor substrate, and the common cathode is formed by the low-density layer and the buried layer segmented and isolated by the isolation region.

14. The semiconductor device according to claim 13, wherein the thickness of the buried layer is greater than the optical-absorption length.

15. The semiconductor device according to claim 1, wherein the photodiodes receive reflected light reflected off an optical disk, and in that the semiconductor device uses an output of the common cathode as an RF signal and performs focus signal processing and tracking signal processing using outputs of the plurality of separate anodes, or the semiconductor device uses an output of the common anode as an RF signal and performs focus signal processing and tracking signal processing using outputs of the plurality of separate cathodes.

* * * * *